(12) United States Patent
Izuha et al.

(10) Patent No.: US 9,177,984 B2
(45) Date of Patent: Nov. 3, 2015

(54) SOLID-STATE IMAGING DEVICE AND ELECTRONIC APPARATUS HAVING A SOLID-STATE IMAGING DEVICE

(75) Inventors: Kyoko Izuha, Kanagawa (JP); Keisuke Shimizu, Kanagawa (JP); Toshiyuki Kobayashi, Kanagawa (JP); Nozomi Kimura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 494 days.

(21) Appl. No.: 13/421,161

(22) Filed: Mar. 15, 2012

(65) Prior Publication Data

US 2012/0249829 A1 Oct. 4, 2012

(30) Foreign Application Priority Data

Mar. 29, 2011 (JP) ................................. 2011-072177
Dec. 12, 2011 (JP) ................................. 2011-271364

(51) Int. Cl.
*H04N 5/335* (2011.01)
*H01L 27/146* (2006.01)
*H01L 27/148* (2006.01)

(52) U.S. Cl.
CPC .... *H01L 27/14621* (2013.01); *H01L 27/14623* (2013.01); *H01L 27/14625* (2013.01); *H01L 27/14685* (2013.01); *H01L 27/14806* (2013.01); *H01L 27/14643* (2013.01)

(58) Field of Classification Search
CPC .................................................... H04N 5/374
USPC ................................ 348/311, 53, 340; 156/60
See application file for complete search history.

(56) References Cited

U.S. PATENT DOCUMENTS

| | | | | |
|---|---|---|---|---|
| 5,254,849 A | * | 10/1993 | Murakami et al. | 250/208.1 |
| 5,986,704 A | * | 11/1999 | Asai et al. | 348/340 |
| 2007/0242196 A1 | * | 10/2007 | Yoshida et al. | 349/114 |
| 2009/0298220 A1 | * | 12/2009 | Anderson et al. | 438/70 |
| 2009/0322861 A1 | * | 12/2009 | Jacobs et al. | 348/53 |
| 2011/0041980 A1 | * | 2/2011 | Kim et al. | 156/60 |

FOREIGN PATENT DOCUMENTS

| | | |
|---|---|---|
| JP | 08-294059 | 11/1996 |
| JP | 2011-017819 | 1/2011 |
| JP | 07-094699 | 4/2011 |

OTHER PUBLICATIONS

Extended European Search Report for European Patent Application No. 12002001.1 dated Feb. 21, 2014, 11 pages.
Park et al., "Doped graphene electrodes for organic solar cells," Nanotechnology, 2010, vol. 21, No. 50, 6 pages.
Partial European Search Report for European Patent Application No. 12002001.1 dated Oct. 31, 2013, 7 pages.

* cited by examiner

*Primary Examiner* — Joel Fosselman
(74) *Attorney, Agent, or Firm* — Hazuki International, LLC

(57) ABSTRACT

A solid-state imaging device includes: a substrate; a photoelectric conversion unit that is formed on the substrate and generates signal charge in correspondence with a light amount of incident light; and a transparent electrode that is formed in an upper portion of the substrate and includes a first area formed from a nano carbon material and a second area that is brought into contact with the first area and has light transmittance higher than that of the first area.

21 Claims, 19 Drawing Sheets

SOLID-STATE IMAGING DEVICE AND ELECTRONIC APPARATUS HAVING A SOLID-STATE IMAGING DEVICE

FIELD

The present disclosure relates to a solid-state imaging device including a transparent electrode, an electronic apparatus including the solid-state imaging device, and an electronic apparatus including a transparent electrode.

BACKGROUND

A solid-state imaging device that is represented by a CCD (Charge Coupled Device) image sensor or a CMOS (Complementary Metal Oxide Semiconductor) image sensor includes a photoelectric conversion unit that is configured by a photodiode formed on the light receiving face side of a substrate and a charge transfer unit. In such a solid-state imaging device, light incident from the light receiving face side is photoelectrically converted by the photodiode so as to generate signal charge according to the amount of light. Then, the generated signal charge is transferred to a charge transfer unit and is output as a video signal.

In such a device, since a structure is employed in which light incident during an exposure time as a constant time interval is photoelectrically converted and accumulated, it is necessary for the photodiode to be open to the light receiving face side. Accordingly, in a case where an electrode is formed in an area that covers the light receiving face side of the photodiode, it is necessary for the electrode to be formed not from a general electrode material having a light shielding property but from a transparent electrode material.

As disclosed in JP-A-08-294059 and JP-A-07-94699, indium tin oxide (ITO) is mainly used as the material of a general transparent electrode in the related art. In addition, as disclosed in JP-A-2011-17819, in an electronic apparatus represented by a camera or the like, there is an example in which a light control element such as an electrochromic layer is used in an imaging optical system such as an aperture diaphragm or a shutter device. Even in such a case, as the material of a transparent electrode used for applying a desired electric potential to the electrochromic layer, ITO is used. However, ITO that is used as the material of the transparent electrode has low transmittance in the current status, and there are problems in that the sensitivity is decreased, and the optical characteristics change due to a large film thickness.

SUMMARY

It is desirable to provide a solid-state imaging device, in which a transparent electrode is formed, capable of solving the problems of a decrease in the transmittance of the transparent electrode and variations in the optical characteristic due to the film thickness. In addition, it is desirable to provide an imaging apparatus and an electronic apparatus that use the solid-state imaging device.

An embodiment of the present disclosure is directed to a solid-state imaging device having a structure including: a substrate; a photoelectric conversion unit that is formed on the substrate and generates signal charge in correspondence with a light amount of incident light; and a transparent electrode that is formed in an upper portion of the substrate, in which the photoelectric conversion unit is formed, and the material of the transparent electrode is a nano carbon material and has a plurality of openings.

In the solid-state imaging device, by using the nano carbon material having a plurality of openings as the transparent electrode, the transmittance can be improved. In addition, since the nano carbon material is used as a film of a single layer or a plurality of layers, the film thickness is small, and a change in the optical characteristics can be decreased.

Another embodiment of the present disclosure is directed to an electronic apparatus including: an optical lens; a solid-state imaging device to which light collected to the optical lens is incident; and a signal processing circuit that processes an output signal output from the solid-state imaging device. In addition, the solid-state imaging device includes a substrate, a photoelectric conversion unit that is formed on the substrate and generates signal charge in correspondence with a light amount of incident light, and a transparent electrode that is formed in an upper portion of the substrate, is formed from a nano carbon material, and has a plurality of openings.

According to the electronic apparatus, since the transparent electrode that configures the solid-state imaging device is configured by using a nano carbon material having an opening, the transmittance is improved. Accordingly, an electronic apparatus in which the image quality is improved can be acquired.

Still another embodiment of the present disclosure is directed to an electronic apparatus including: an optical lens; a solid-state imaging device that includes a substrate and a photoelectric conversion unit that is formed on the substrate and generates signal charge in correspondence with a light amount of incident light; an aperture diaphragm; and a signal processing circuit that processes an output signal output from the solid-state imaging device. The aperture diaphragm that is arranged in an optical path between the optical lens and the solid-state imaging device and adjusts light beams transmitted from the optical lens. In addition, the aperture diaphragm is configured by a dimming control reacting material layer of which transmittance changes based on an applied voltage and first and second transparent electrodes that hold the dimming control reacting material layer therebetween. Furthermore, at least one transparent electrode of the first and second transparent electrodes is configured by a transparent electrode that is formed from a nano carbon material having a plurality of openings.

Yet another embodiment of the present disclosure is directed to an electronic apparatus including: an optical lens; a solid-state imaging device that includes a substrate and a photoelectric conversion unit that is formed on the substrate and generates signal charge in correspondence with a light amount of incident light; a shutter device; and a signal processing circuit that processes an output signal output from the solid-state imaging device. The shutter device is arranged in an optical path between the optical lens and the solid-state imaging device and controls an exposure time toward the photoelectric conversion unit. In addition, the shutter device is configured by a dimming control reacting material layer of which transmittance changes based on an applied voltage and first and second transparent electrodes that hold the dimming control reacting material layer therebetween. Furthermore, at least one transparent electrode of the first and second transparent electrodes is configured by a transparent electrode that is formed from a nano carbon material having a plurality of openings.

According to the electronic apparatus of the embodiment, the aperture diaphragm or the shutter device is configured by a dimming control laminated film, and by changing the transmittance of the dimming control laminated film, the operation of the aperture diaphragm or the shutter device is performed. In addition, in the dimming control laminated film, since at least one transparent electrode of the first and second transparent electrodes is configured by using a nano carbon material having a plurality of openings, a decrease in the thickness of the dimming control laminated film is achieved. In addition, the transmittance at the time of light transmission can be improved.

According to the embodiments of the present disclosure, a transparent electrode is formed from nano carbon having high transmittance and has a plurality of openings, and accordingly, maximum transmittance can be acquired. As a result, even in a case where the transparent electrode is formed on the upper portion of a photoelectric conversion unit, a decrease in sensitivity can be prevented.

DETAILED DESCRIPTION

Hereinafter, examples of a solid-state imaging device, a manufacturing method thereof, and an electronic apparatus according to embodiments of the present disclosure will be described with reference to FIGS. 1 to 31. Embodiments of the present disclosure will be described in the following order. However, the present disclosure is not limited to the examples described below.

Figure 1:
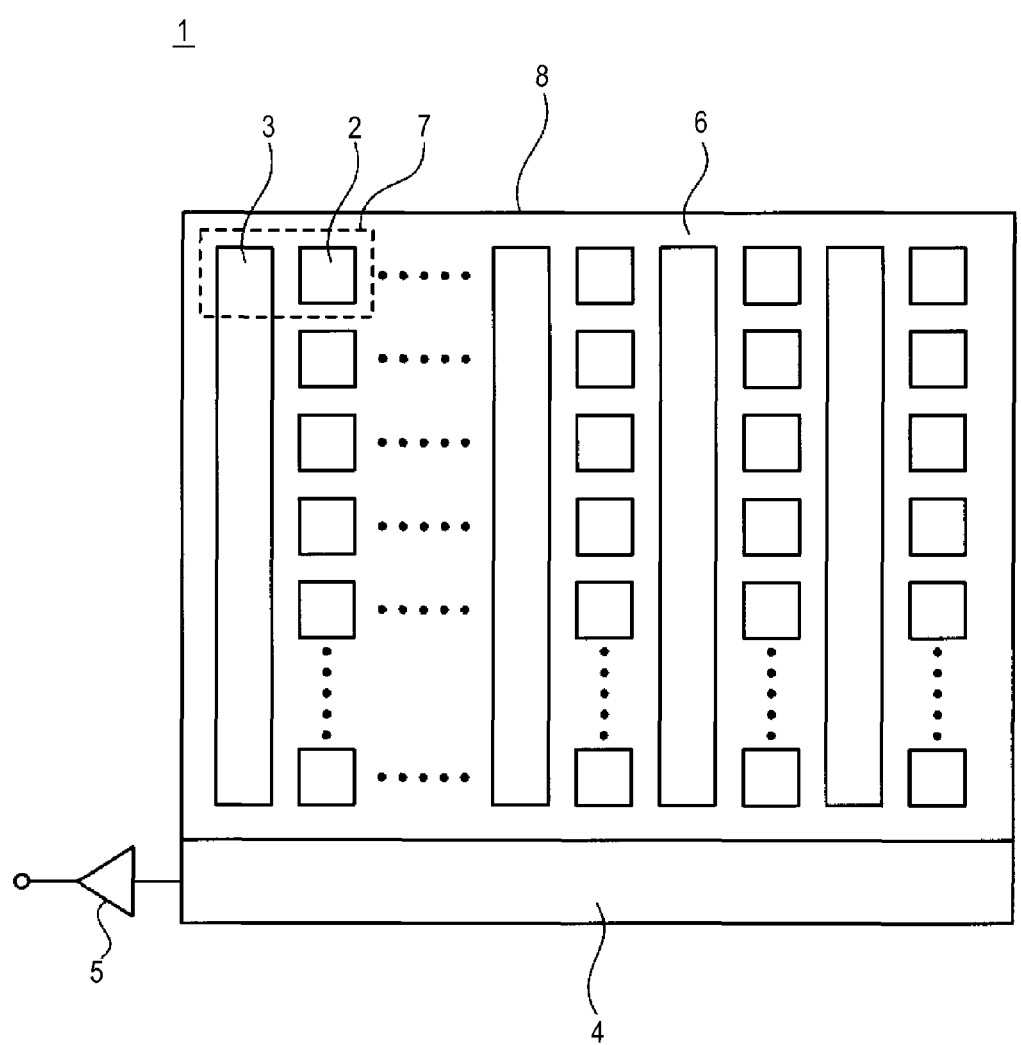
FIG. 1 illustrates the whole configuration of a solid-state imaging device according to a first embodiment of the present disclosure.

1. First Embodiment: Example of Solid-State Imaging Device Formed By Bringing Transparent Electrode into Direct Contact with Substrate 2. Second Embodiment: Example in Which Dimming Control Laminated Film Is Formed On Upper Portion of Solid-State Imaging Device 3. Third Embodiment: Example in Which Dimming Control Laminated Film Formed From Electrochromic Layer Is Formed Immediately above On-Chip Lens 4. Fourth Embodiment: Example of Solid-State Imaging Device in Which Dimming Control Laminated Film Formed From Electrochromic Layer Is Formed To Be Common To All Pixels in Lower Layer of Color Filter 5. Fifth Embodiment: Example of Solid-State Imaging Device in Which Dimming Control Laminated Film Formed From Electrochromic Layer Is Formed For Each Pixel/Pixel Row in Lower Layer of Color Filter 6. Sixth Embodiment: Example of Solid-State Imaging Device in Which Dimming Control Laminated Film Formed From Electrochromic Layer Is Formed For Predetermined Pixel in Lower Layer of Color Filter 7. Seventh Embodiment: Example of Solid-State Imaging Device in Which Dimming Control Laminated Film Formed From Liquid Crystal Layer Is Formed In Lower Layer of Color Filter 8. Eighth Embodiment: Example of Solid-State Imaging Device in Which Photoelectric Conversion Layer Having Organic Photoelectric Conversion Film Is Formed Immediately above On-Chip Lens 9. Ninth Embodiment: Electronic Apparatus Including Solid-State Imaging Device in Which Dimming Control Laminated Film Is Formed 10. Tenth Embodiment: Electronic Apparatus Including Aperture Diaphragm Formed From Dimming Control Laminated Film 11. Eleventh Embodiment: Electronic Apparatus Including Shutter Formed From Dimming Control Laminated Film 1. First Embodiment Solid-State Imaging Device FIG. 1 illustrates the whole configuration of a solid-state imaging device 1 according to a first embodiment of the present disclosure. In this embodiment, a CCD-type solid-state imaging device in which a transparent electrode is formed on the front face of a substrate for reducing noise will be described as an example.

As illustrated in FIG. 1, the solid-state imaging device 1 of this embodiment is configured to include a plurality of light receiving units 2 formed on a substrate 6, a vertical transfer register 3, a horizontal transfer register 4, and an output circuit 5. A unit pixel 7 is configured by one light receiving unit 2 and the vertical transfer register 3 adjacent to the light receiving unit 2. In addition, an area in which a plurality of pixels 7 are formed is formed as a pixel area 8.

The light receiving unit 2 is configured by a photoelectric conversion unit that is formed from a photodiode, and a plurality of the light receiving units 2 are formed in a matrix pattern in the horizontal direction and the vertical direction of the substrate 6. In the light receiving unit 2, signal charge is generated in accordance with incident light through photoelectric conversion and is accumulated.

The vertical transfer register 3 is formed to have a CCD structure, and a plurality of the vertical transfer registers 3 are formed in the vertical direction for each light receiving unit 2 arranged in the vertical direction. This vertical transfer register 3 reads out signal charge accumulated in the light receiving unit 2 and transfers the signal charge in the vertical direction. A transfer stage on which the vertical transfer register 3 of this exemplary embodiment is formed, for example, is configured to be driven with four phases in accordance with a transfer pulse that is applied by a transfer driving pulse circuit that is not illustrated in the figure. In addition, a final stage of the vertical transfer register 3 is configured to transfer signal charge maintained on the final stage to the horizontal transfer register 4 in accordance with the application of the transfer pulse.

The horizontal transfer register 4 is formed to have a CCD structure and is formed at one end of the final stage of the vertical transfer register 3. The transfer stage on which the horizontal transfer register 4 is formed transfers the signal charge that is vertically transferred by the vertical transfer register 3 in the horizontal direction for each horizontal line.

The output circuit 5 is formed at the final stage of the horizontal transfer register 4. The output circuit 5 performs electric charge-to-voltage conversion of the signal charge that is horizontally transferred by the horizontal transfer register 4 and outputs a resultant signal as a video signal.

According to the solid-state imaging device 1 having the above-described configuration, the signal charge that is generated and accumulated by the light receiving unit 2 is transferred in the vertical direction by the vertical transfer register 3 and is transferred to the inside of the horizontal transfer register 4. Then, the signal charge transferred to the inside of the horizontal transfer register 4 is transferred in the horizontal direction and is output as a video signal through the output circuit 5.

Figure 2:
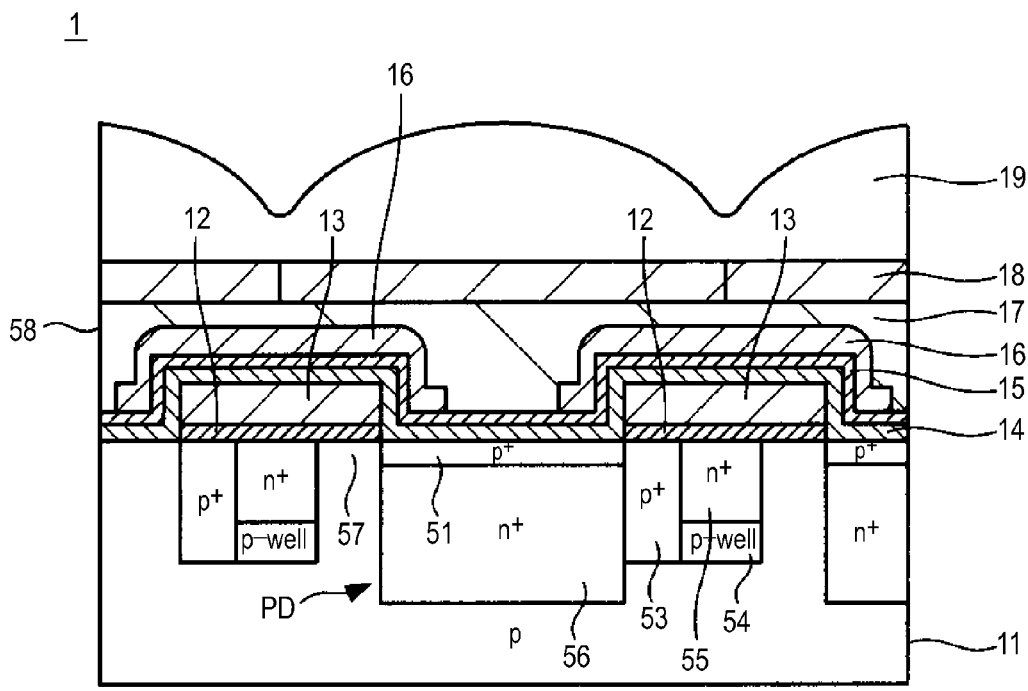
FIG. 2 is a schematic cross-sectional view illustrating the configuration of a main portion of the solid-state imaging device according to the first embodiment of the present disclosure.

Next, the cross-sectional configuration of the pixel area 8 of the solid-state imaging device 1 according to this exemplary embodiment will be described. FIG. 2 is a schematic cross-sectional view illustrating the configuration of pixels 7, which are adjacent to each other in the horizontal direction, of the solid-state imaging device 1 according to this exemplary embodiment.

As illustrated in FIG. 2, the solid-state imaging device 1 according to this exemplary embodiment includes a substrate 11, a wiring layer 58, a color filter layer 18, and an on-chip lens 19.

The substrate 11 is configured by a semiconductor substrate that is formed from silicon and, for example, is configured by a p-type semiconductor layer. In a desired area located on the light incident side of the substrate 11, a photoelectric conversion unit PD that is formed from a photodiode is formed. In the photoelectric conversion unit PD, a main photodiode is configured by a p-n junction of a p-type semiconductor area 51 of high density that is formed on the front face side of the substrate 11 and an n-type semiconductor area 56 that is formed at the lower portion thereof. In the photoelectric conversion unit PD, photoelectric conversion of incident light is performed, whereby signal charge is generated and accumulated.

In addition, in an area adjacent to the photoelectric conversion unit PD, a transfer channel unit 55 is formed which configures the vertical transfer register 3 having the CCD structure illustrated in FIG. 1. The transfer channel unit 55 is configured by an n-type semiconductor area that is formed so as to extend in the vertical direction, and one transfer channel unit 55 is formed for each column. Furthermore, in a lower portion of the n-type semiconductor area that configures the transfer channel unit 55, a p-well layer 54 is formed which is configured by a p-type semiconductor area. In addition, an area between the transfer channel unit 55 and the photoelectric conversion unit PD is configured as a read-out channel unit 57, and the signal charge generated and accumulated by the photoelectric conversion unit PD is read out by the transfer channel unit 55 through the read-out channel unit 57 and is transferred through the inside of the transfer channel unit 55. Furthermore, in an area surrounding one photoelectric conversion unit PD and the transfer channel unit 55 that is adjacent to the photoelectric conversion unit PD, an element isolating area 53 that is configured by a high-density p-type semiconductor area is formed. An area that is surrounded by the element isolating area 53 configures one pixel.

The wiring layer 58 is configured by a transfer electrode 13, a transparent electrode 14, an insulating film 15, a light shielding film 16, and an interlayer insulating film 17. The transfer electrode 13 is formed in an upper portion of the transfer channel unit 55 and the read-out channel unit of the substrate 11 through the gate insulating film 12, and a plurality of the transfer electrodes 13 are formed so as to be isolated in the vertical direction along the transfer channel unit 55.

The transparent electrode 14 is composed of graphene and is formed on the whole face of the substrate 11 that is located on the light incident side so as to cover the substrate surface located on the light incident side on the photoelectric conversion unit PD in which the transfer electrode 13 is not formed and cover the transfer electrode 13 through the insulating film 15. The transparent electrode 14 is provided with the ground electric potential through a wiring that is not illustrated in the figure. A detailed configuration of the transparent electrode 14 will be described later.

The light shielding film 16 is formed so as to cover the transfer electrode 13 through the interlayer insulating film 17 that is formed on the whole face of the upper portion of the transparent electrode 14, and an end portion located on a side that is brought into contact with the photoelectric conversion unit PD is formed so as to partially hang over the upper portion of the photoelectric conversion unit PD. The light shielding film 16 is formed by using a material that can shield light and, for example, is formed by using Al, W, or the like.

In the wiring layer 58, the interlayer insulating film 17 that covers the transfer electrode 13 and the transparent electrode 14 and flattens the surface is included. In FIG. 2, although only the transfer electrode 13, the transparent electrode 14, and the light shielding film 16 are illustrated in the wiring layer 58, desired films such as a wiring film that is used for supplying a driving pulse to the transfer electrode 13 and a metal light shielding film are additionally formed in the wiring layer 58.

The color filter layer 18 is formed on an upper portion of the wiring layer 58 that is flattened, and the color filter layers 18 of R (red), G (green), and B (blue) are formed for each pixel and, for example, is arranged so as to be a Bayer array. Alternatively, as the color filter layer 18, a color filter layer that transmits the same color for all the pixels 7 may be used. The combination of colors in the color filter layer can be variously selected in accordance with the specification.

The on-chip lens 19 is formed on an upper portion of the color filter layer 18, and the front face thereof is in a convex shape for each pixel 7. Incident light is collected by the one-chip lens 19 and incident on the photoelectric conversion unit PD of each pixel 7 with high efficiency.

As above, in the solid-state imaging device 1 according to this exemplary embodiment, the incident light is collected so as to be incident on the photoelectric conversion unit PD of the substrate 11 by the on-chip lens 19. Then, in the photoelectric conversion unit PD, signal charge corresponding to the light amount of the incident light is generated and accumulated, and the accumulated signal charge is transferred in the vertical direction through the transfer channel unit 55. Thereafter, the signal charge is horizontally transferred in the horizontal transfer register 4 and then output as a video signal.

In the solid-state imaging device 1 according to this exemplary embodiment, the transparent electrode 14 is formed so as to be directly brought into contact with the front face of the substrate 11 that is located on the upper part of the photoelectric conversion unit PD and is configured to be supplied with the ground electric potential. Accordingly, since the transparent electrode 14 acts as the drain of holes, holes (positive holes) accumulated in the p-type semiconductor area of each photoelectric conversion unit PD are swept out through the transparent electrode 14. Therefore, the signal charge amount (Qs) in each photoelectric conversion unit PD is at the same level as that of the photoelectric conversion units PD located on the upper and lower sides in the vertical direction, whereby the unevenness of the signal charge amount (Qs) can be decreased.

In a solid-state imaging device 1 in the related art in which the transparent electrode 14 is not formed, a depletion area can be widened on the boundary of the p-type semiconductor area that configures the photoelectric conversion unit PD due to impurity ions that are present within a phosphorous gate glass film configuring the interlayer insulating film 17 located on the upper portion of the light shielding film 16. As a result, there is a concern that a dark current may increase. On the other hand, according to this exemplary embodiment, by disposing the transparent electrode 14 so as to be directly brought into contact with the substrate located on the upper portion of the photoelectric conversion unit PD, the depletion of the boundary is prevented, whereby the dark current can be decreased.

Next, the configuration of the transparent electrode 14 that is used in this exemplary embodiment will be described in detail.

Figure 3:
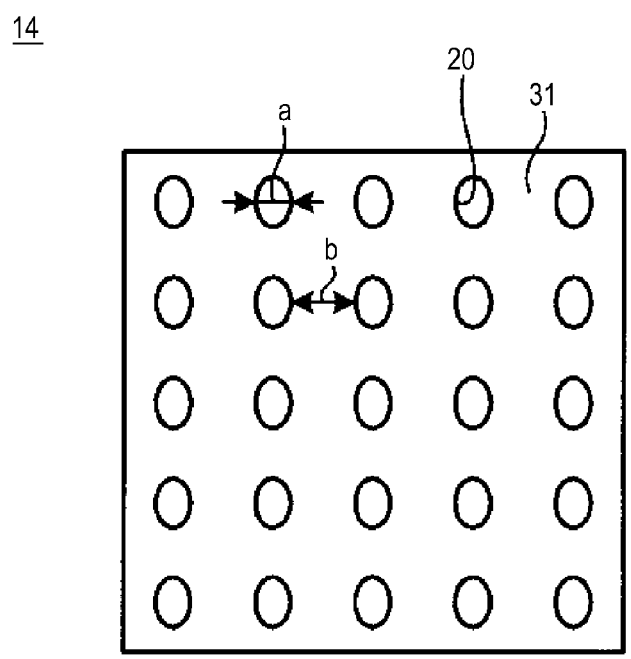
FIG. 3 is a schematic plan view illustrating the configuration of a transparent electrode used in the solid-state imaging device according to the first embodiment of the present disclosure.

FIG. 3 shows a plan view illustrating the configuration of the transparent electrode 14 that is used in this exemplary embodiment. As illustrated in FIG. 3, in this exemplary embodiment, the transparent electrode 14 has a first area (hereinafter, referred to as an electrode portion 31) that is formed from graphene and a second area that is formed from a plurality of air gaps (hereinafter, referred to as openings 20) and is configured in the shape of a film (sheet shape). The graphene that is used for the transparent electrode 14 in this exemplary embodiment is a material formed from polyaromatic molecules formed by combining a plurality of carbon atoms and is in the shape of a film. This film-shape graphene is formed by covalently bonding carbon atoms and is understood to be configured as a single layer, and the thickness of one layer is about 0.3 nm.

As the material characteristics of grapheme that configures the transparent electrode 14, the transmittance in a case where there is no opening 20 is 97.7Ω, the thickness of the layer is 0.3 nm in the case of a single layer, and the resistance value is about 100Ω. By stacking the film-shaped graphene, which is configured as a single layer, to be a plurality of layers, the transmittance and the resistance value can be changed. Accordingly, by changing the number of stacked layers of graphene, the transmittance and the resistance value of the transparent electrode 14 can be appropriately adjusted based on the characteristics demanded to the device.

For example, by stacking the film-shaped graphene, the transmittance decreases by 2.3% for every layer. In addition, the resistance value of the graphene in the case of two layers is ½ of the resistance value in the case of one layer, and the resistance value in the case of three layers of the graphene is ⅓ of the resistance value in the case of one layer. Furthermore, by forming an opening 20 in the graphene that configures the transparent electrode 14, the transmittance can be increased to be higher than 97.7% that is the transmittance of the material.

Figure 4:
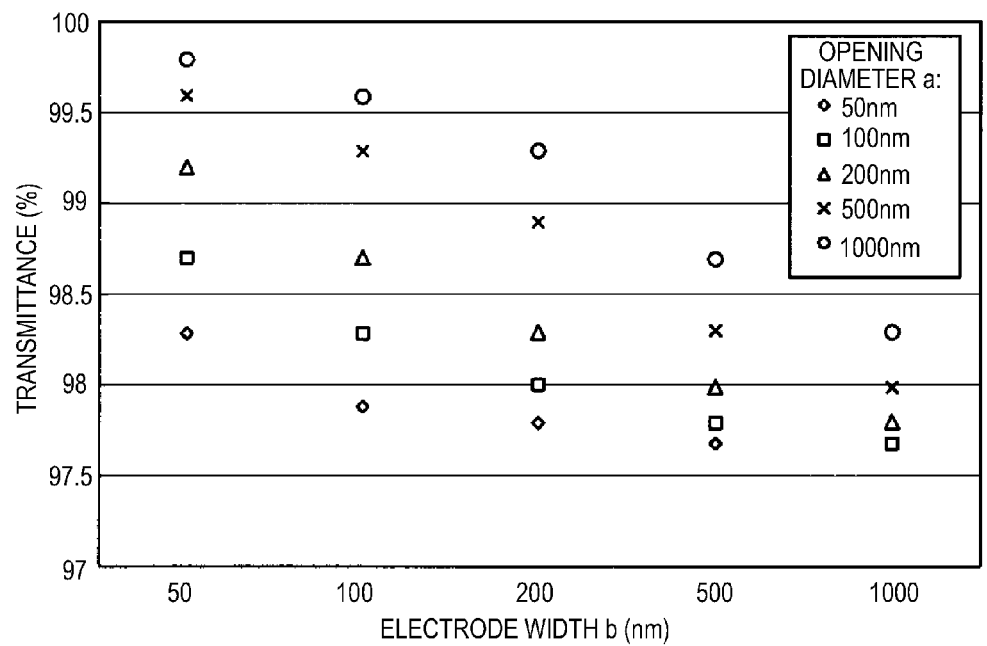
FIG. 4 is a diagram illustrating a change in the transmittance of the transparent electrode in a case where the diameter of an opening is fixed, and an electrode width is changed.

As illustrated in FIG. 3, the transparent electrode 14 used in this exemplary embodiment is configured to include a plurality of openings 20. When an average diameter (hereinafter, referred to as an opening diameter) of the openings 20 is denoted by "a", an average dimension (hereinafter, referred to as an electrode width) between openings adjacent to each other is denoted by "b", changes in transmittance in a case where the opening diameter a is fixed, and the electrode width b is changed is illustrated in FIG. 4. In FIG. 4, the horizontal axis is the electrode width b, and the vertical axis is the transmittance.

As illustrated in FIG. 4, it can be understood that the transmittance of graphene increases in accordance with an increase in the opening diameter a and a decrease in the electrode width b and continuously changes in accordance with the dimensions of the opening diameter a and the electrode width b. Accordingly, by determining target transmittance (hereinafter, referred to as target transmittance Tm), the dimensions of the opening diameter a and the electrode width b can be set. Hereinafter, a method of setting the dimensions of the opening diameter a and the electrode width b using an equation will be illustrated.

First, the target transmittance Tm can be acquired by using Equation (1) using the transmittance of a case where the opening 20 is not formed in the graphene, that is, the transmittance (hereinafter, referred to as normal transmittance Ti=2.3%) in a case where the coverage factor according to the graphene is 100% and the aperture ration A (%).

$$Tm = 100 - Ti \times A \quad (1)$$

At this time, the aperture ration ratio A (%) can be represented by Equation (2) using the opening diameter a and the electrode width b.

$$A = \{(a+b)^2 - a^2\}/(a+b)^2 \quad (2)$$

Accordingly, by determining the target transmittance Tm, the aperture ratio A (%) can be acquired by using Equation (1), and, by determining one of the opening diameter a and the electrode width b by substituting the aperture ratio A (%) in Equation (2), the value of the other can be calculated. Then, by forming the opening in the graphene by applying the opening diameter a and the electrode width b, the transparent electrode 14 having the target transmittance Tm can be formed.

For example, in a case where the target transmittance Tm is 98%, the aperture ratio A(%) is 86.95% (derived by 98=100−2.3 A) by using Equation (1). When the opening diameter a is determined as 50 nm, by using Equation (2) with the electrode width as x, x (that is the electrode width b) is approximately 100 by using $86.95 = \{(50+b)^2 - a^2\}/(a+b)^2$. In other words, the electrode width b is demanded to be 100 nm.

However, in order to allow the transparent electrode 14 formed from graphene to have conductivity, it is preferable that the width of the narrowest portion of the electrode portion 31 is larger than 10 nm. Accordingly, in this embodiment, it is preferable that the opening 20 of the transparent electrode 14 is set in the range in which the narrowest portion of the electrode width b is equal to or larger than 10 nm.

Figure 5:
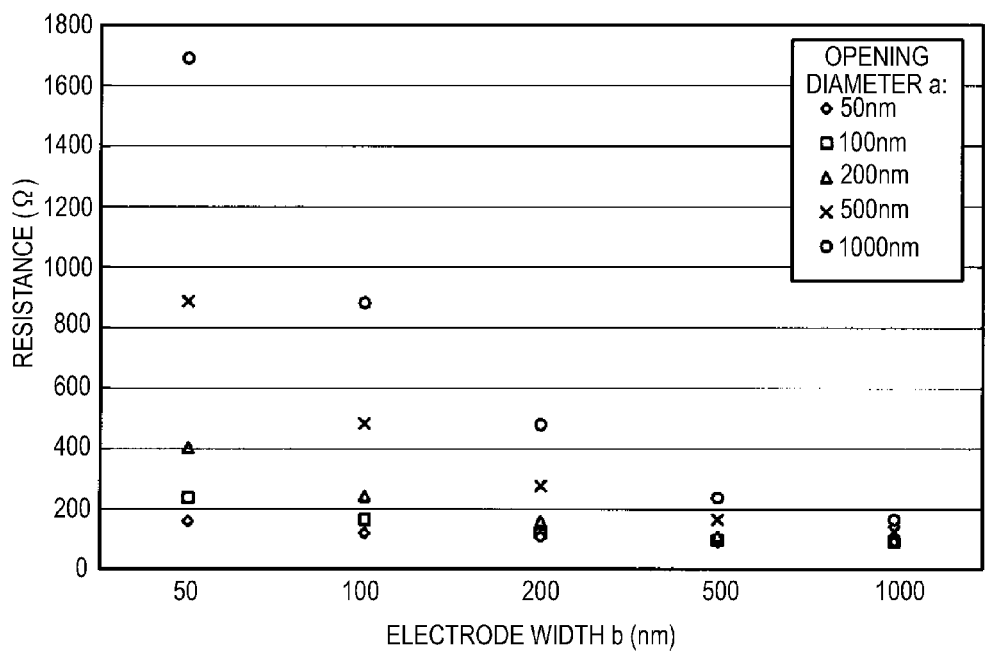
FIG. 5 is a diagram illustrating a change in the resistance of the transparent electrode in a case where the diameter of the opening is fixed, and the electrode width is changed.

In addition, the resistance of the transparent electrode 14 changes in accordance with the opening diameter a and the electrode width b formed in the transparent electrode 14. FIG. 5 is a diagram illustrating a change in the resistance of the transparent electrode in a case where the opening diameter a is fixed, and the electrode width b is changed. As illustrated in FIG. 5, it is understood that the larger the opening diameter a is, the higher the resistance is, and the larger the electrode width b is, the lower the resistance is. In this embodiment, the resistance of the transparent electrode 14 can be also changed by the shape of the opening 20 instead of stacking the transparent electrode 14.

Figure 6:
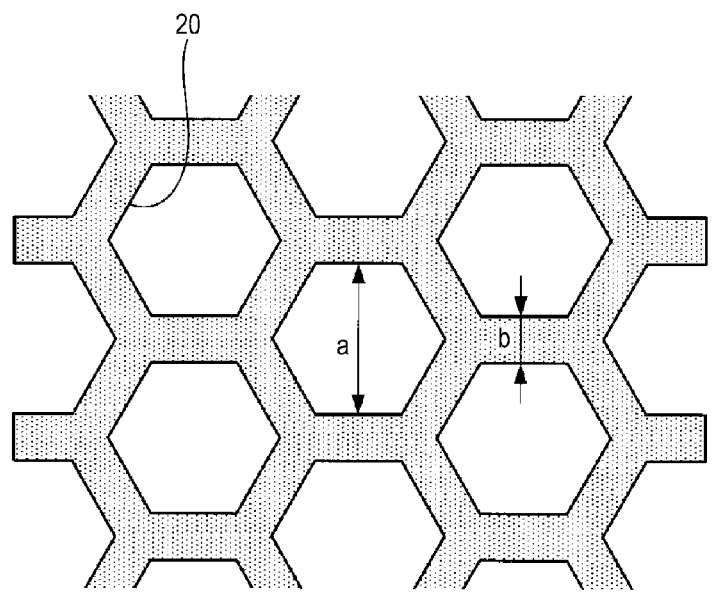
FIG. 6 is a schematic diagram illustrating the configuration of the transparent electrode that is used when the transmittance and the resistance with respect to the aperture ratio are actually measured.

Next, the result of measurement of the transmittance (%) and the resistance (Ω) with respect to the aperture ratio of the transparent electrode 14 will be described. FIG. 6 schematically illustrates the configuration of the transparent electrode 14 that is used when the transmittance and the resistance with respect to the aperture ratio are actually measured. In this experiment, as illustrated in FIG. 6, the transparent electrode 14 was used in which regular hexagon-shaped openings 20 are formed. In the evaluation presented below, the aperture ratio is changed in the range of 0 to 87.5% by fixing the electrode width b illustrated in FIG. 6 to 8 μm and changing the opening diameter a, and the transmittance and the resistance were measured respectively.

Figure 7:
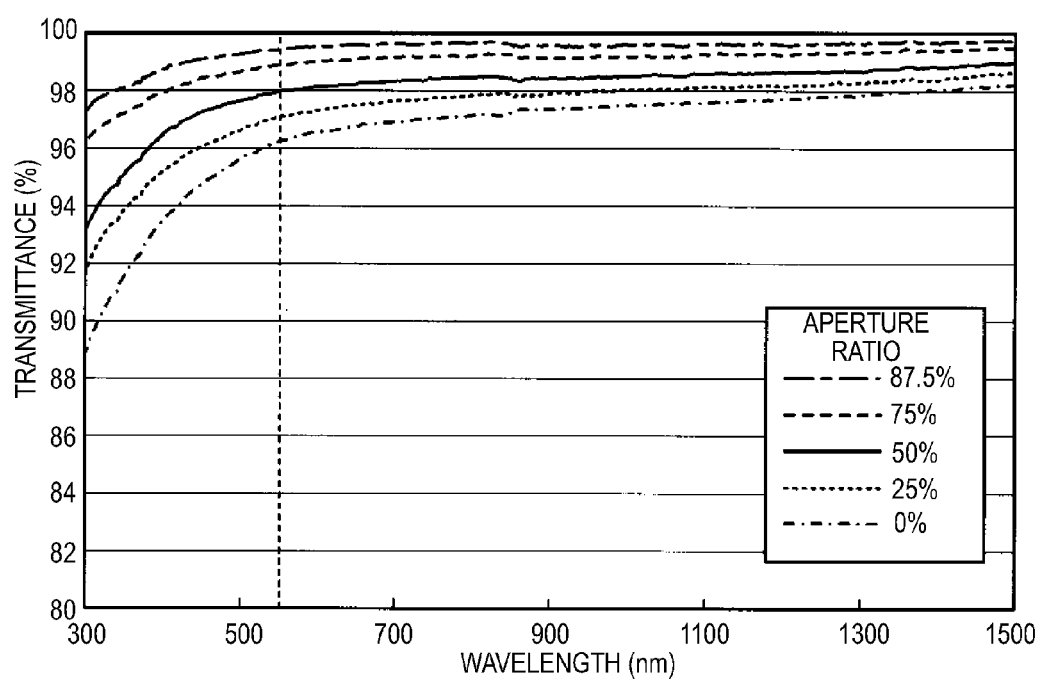
FIG. 7 is a result (1) of measurements of the transmittance when the aperture ratio of the transparent electrode is changed in the range of 0 to 87.5%.
Figure 8:
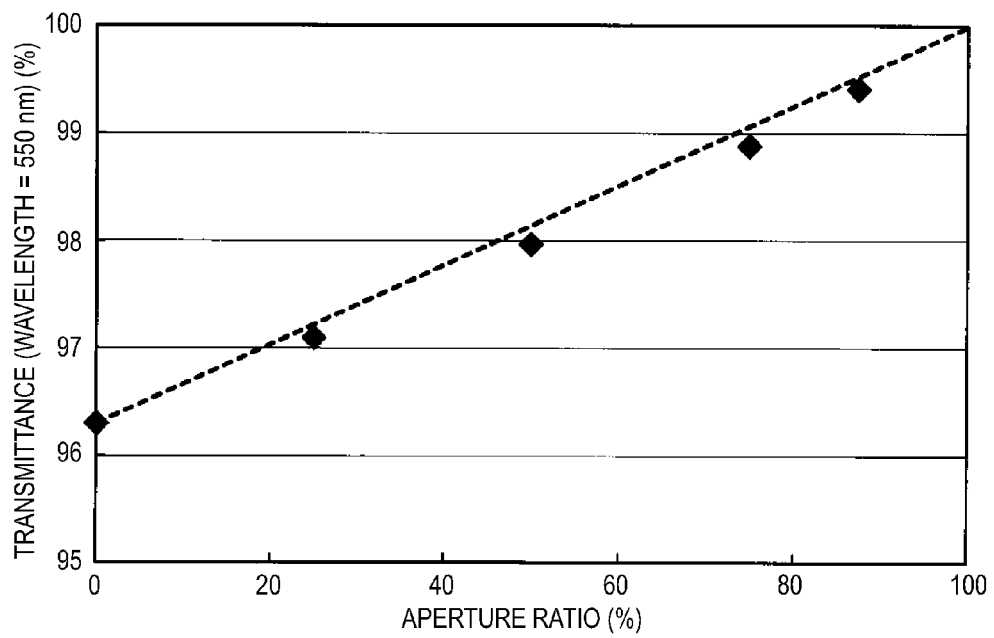
FIG. 8 is a result (2) of measurements of the transmittance when the aperture ratio of the transparent electrode is changed in the range of 0 to 87.5%.

FIGS. 7 and 8 illustrate the results of measurements of the transmittance when the aperture ratio of the transparent electrode 14 illustrated in FIG. 6 is changed in the range of 0 to 87.5%. In FIG. 7, the transmittance at a time when the wavelength is changed in the range of 300 nm to 1500 nm is illustrated, the horizontal axis is the wavelength (nm), and the vertical axis is the transmittance (%). On the other hand, in FIG. 8, the transmittance with respect to the aperture ratio at a time when the wavelength is fixed to 550 nm is illustrated, the horizontal axis is the aperture ratio (%), and the vertical axis is the transmittance (%).

As illustrated in FIG. 7, it can be understood that, in the entire measured wavelength region, the transmittance increases in accordance with an increase in the aperture ratio. While the transmittance for the visible region (for example, the wavelength=550 nm) is 96.3% in a case where the aperture ratio is 0%, it can be understood that the transmittance of 99% or more can be achieved by setting the aperture ratio to 87.5%. In addition, as is apparent from FIG. 8, it can be understood that the transmittance increases in proportion to the aperture ratio in a case where the wavelength is set to be constant.

In a case where the solid-state imaging device is applied to an electronic apparatus such as a mobile apparatus or a camcorder that images a moving subject, it is demanded that a transparent electrode having higher transmittance be applied to the solid-state imaging device. Accordingly, it is ideal that the transmittance of the transparent electrode 14 used in the solid-state imaging device 1 according to this exemplary embodiment under lightness is close to 100%, and it is preferable that at least the transmittance of 99% or more can be realized. Accordingly, it is preferable that the aperture ratio of the transparent electrode 14 used in the solid-state imaging device 1 according to this embodiment is equal to or higher than 87.5%.

In the solid-state imaging device 1 according to this embodiment, by using the transparent electrode 14 that can realize transmittance of 99% or higher, the solid-state imaging device 1 can be applied to a specific-purpose dedicated apparatus such as a monitoring camera or a medical imaging apparatus in addition to a general-consumer electronic apparatus such as a mobile apparatus or a camcorder. In addition, not only a still image but also a moving subject image can be photographed by using such an electronic apparatus.

Figure 9:
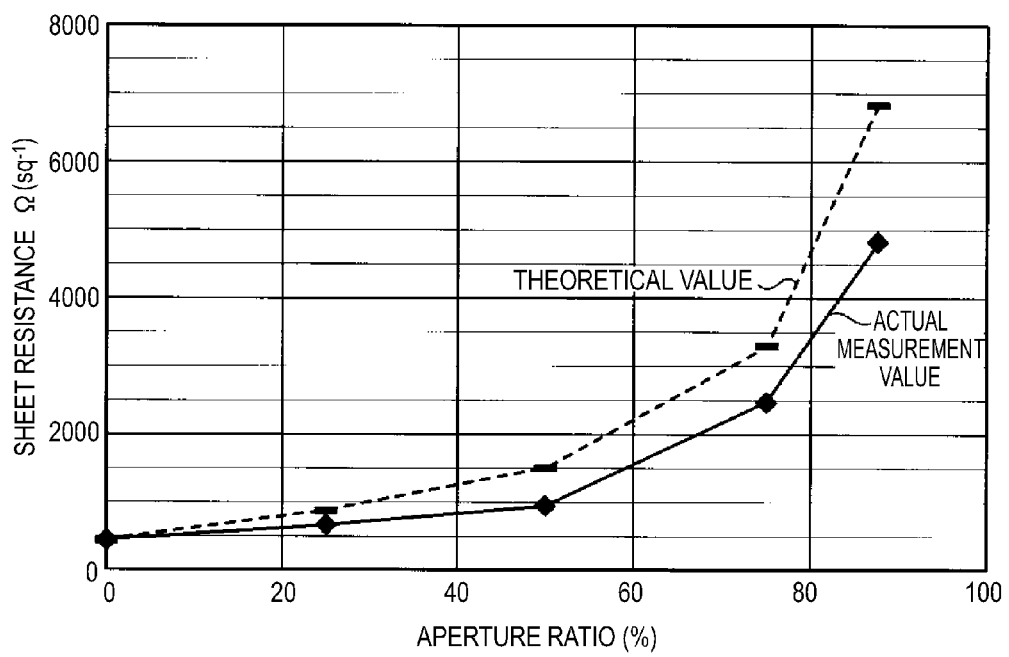
FIG. 9 is a diagram illustrating the resistance (the value of an actual measurement) at a time when the aperture ratio of the transparent electrode is changed in the range of 0 to 87.5% and the resistance (theoretical value) of a transparent electrode having an opening that is calculated by using Equation (3).

Next, FIG. 9 illustrates the resistance (the value of an actual measurement) at a time when the aperture ratio of the transparent electrode 14 illustrated in FIG. 6 is changed in the range of 0 to 87.5% and the resistance R (theoretical value) of the transparent electrode having an opening that is calculated by using Equation (3).

$$R = \{(2a+b) \times R_0\} / \{(a+b) \times (1-p)\} \quad (3)$$

Here, a denotes an opening diameter, b denotes an electrode width, p denotes an aperture ratio of an electrode that is formed from graphene, and $R_0$ is a resistance value of the transparent electrode that is formed from graphene in a case where any opening is not arranged.

As illustrated in FIG. 9, the resistance of the transparent electrode 14 tends to be larger as the aperture ratio is increased. In addition, although the actually measured value is a resistance value lower than the theoretical value calculated by using Equation (3), the tendency of the actual value was similar to that of the theoretical value.

Figure 10:
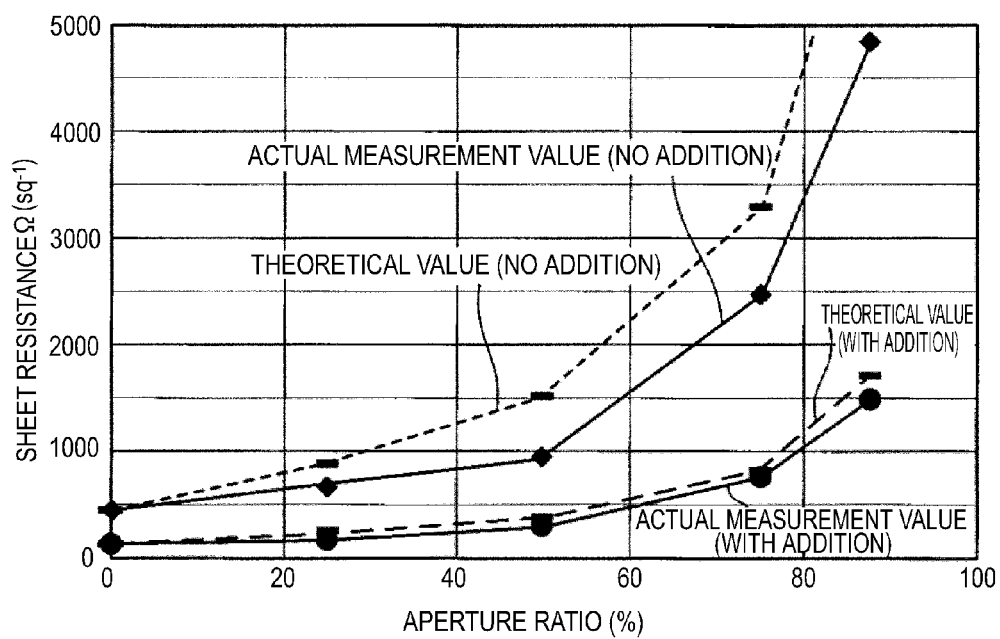
FIG. 10 is a diagram illustrating the resistance (the value of an actual measurement) in a case where $AuCl_3$ is added to the transparent electrode and the resistance (theoretical value) of the transparent electrode in a case where the addition of $AuCl_3$ is considered.

Next, FIG. 10 is a diagram illustrating the resistance (the value of an actual measurement) in a case where $AuCl_3$ is added to the transparent electrode 14 and a surface modification is made for the transparent electrode 14 and the resistance (theoretical value) of the transparent electrode in a case where the addition of $AuCl_3$ is considered. In the evaluation illustrated in FIG. 10, a transparent electrode to which $AuCl_3$ is added is generated by performing spin-coat of a nitromethane solution containing 5 mmol concentration of $AuCl_3$ for the transparent electrode having a desired aperture ratio, and the resistance value thereof was measured. FIG. 10 illustrates an actual measurement value of the resistance and a theoretical value acquired by using Equation (3) for the aperture ratio illustrated in FIG. 9 with being combined together. In FIG. 10, the horizontal axis is the transmittance, and the vertical axis is the resistance value.

As illustrated in FIG. 10, it can be understood that the resistance of the transparent electrode 14 can be decreased by adding $AuCl_3$. Accordingly, by adding $AuCl_3$, the transparent electrode 14 having high transmittance and a low resistance value can be acquired, whereby it is possible to acquire a solid-state imaging device of which the transmittance and the resistance value are adjusted in accordance with the specifications of an electronic apparatus. In the evaluation illustrated in FIG. 10, although $AuCl_3$ is added, any material that decreases the resistance value of the transparent electrode 14 may be used, and $HAuCl_4$, $HNO_3$, HCl, or the like other than $AuCl_3$ may be used.

The transparent electrode 14 formed from graphene can be formed by using a general manufacturing method and, for example, can be formed by using the following method. First, a film that contains a graphite catalyst is formed as a film on a substrate formed from silicon or the like. Thereafter, a gas-phase carbon supplying source is supplied to the film of the graphite catalyst, and the gas-phase carbon supplying source is thermally processed so as to generate graphene. Then, by cooling the graphene at predetermined cooling speed, the film-shaped graphite is formed on the upper portion of the graphite catalyst.

As the graphite catalyst, at least one metal selected from among Ni, Co, Fe, Pt, Au, Al, Cr, Cu, Mg, Mn, Mo, Rh, Si, Ta, Ti, W, U, V, and Zr or a combination thereof may be used. In addition, as the gas-phase carbon supplying source, for example, at least one selected from among carbon dioxide, methane, ethane, ethylene, ethanol, acetylene, propane, butane, butadiene, pentane, pentene, cyclopentadien, hexane, cyclohexane, benzene, and toluene may be used.

By separating the film-shaped graphite formed as above from the graphite catalyst film, the graphite can be used as the transparent electrode 14. The transparent electrode 14 according to this exemplary embodiment has an opening 20. This opening 20 can be formed by performing an etching process for the graphite formed in the shape of a film. FIGS. 11A to 11D show process diagrams illustrating a method of forming the transparent electrode 14 that has the opening 20.

Figure 11A:
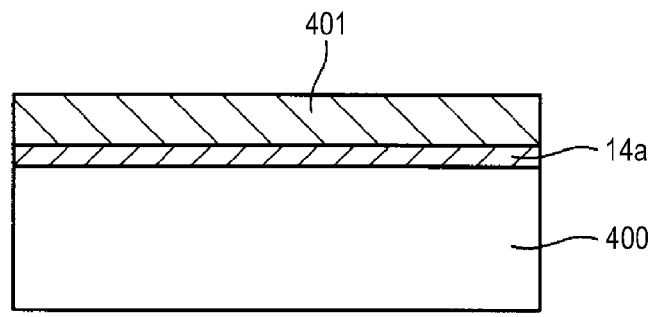
FIGS. 11A to 11D are process diagrams illustrating a method of forming a transparent electrode that has an opening.
Figure 11B:
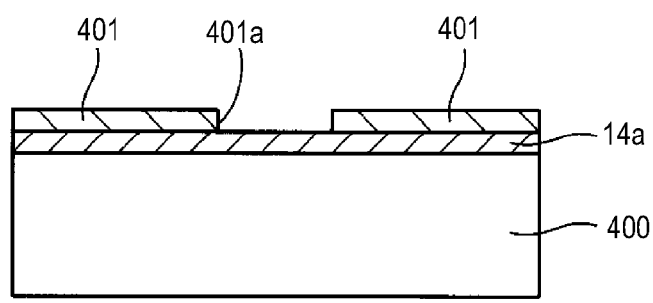

First, as illustrated in FIG. 11A, for example, on the upper portion of a substrate 400 formed from silicon, a graphene film 14a generated as described above is formed, and a resist layer 401 located on the upper portion thereof is formed through spin coat. Next, as illustrated in FIG. 11B, the opening 401a is formed in the resist layer 401 by using a general photolithographic method.

Figure 11C:
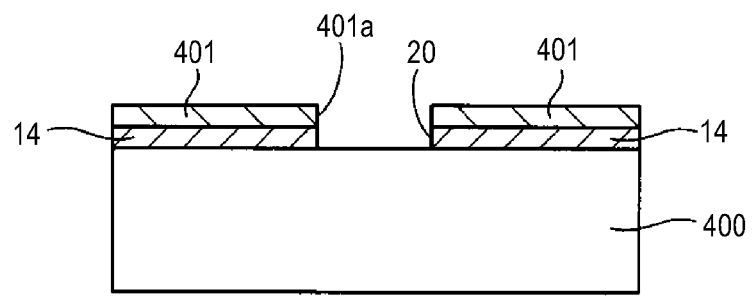
Figure 11D:
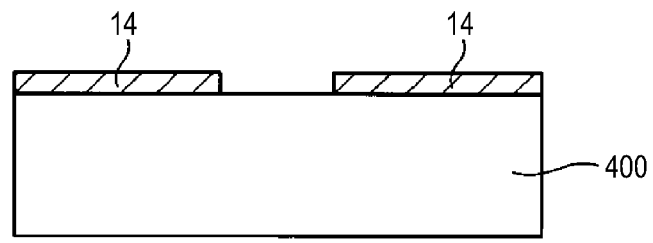

Next, as illustrated in FIG. 11C, the graphene film 14a is etched by using an RIE (Reactive Ion Etching) method using the resist layer 401 having the opening 401a as a mask. Thereafter, as illustrated in FIG. 11D, by removing the resist layer 401, a transparent electrode 14 having the opening 20 is formed.

Then, in this exemplary embodiment, the transparent electrode 14, which has the opening 20 that has been completed, formed from film-shaped graphite is stacked on the light incident side of the substrate 11 on which the photoelectric conversion unit PD is formed. Here, although the film-shaped transparent electrode 14 having the opening 20 is stacked on the upper portion of the substrate 11, it may be configured such that the transparent electrode 14 that is not open is formed on the upper portion of the substrate 11, and, thereafter, the opening 20 is formed.

However, in a case where the opening diameter a of the opening 20 formed in the transparent electrode 14 is large with respect to the pixel size, the opening 20 is recognized as a shape, and there is a problem in that the visibility is degraded. In a case where the opening diameter a of the opening 20 formed in the transparent electrode 14 is less than 10% of the pixel size, there is a little effect on the visibility, and accordingly, it is preferable that the opening diameter of the opening 20 formed in the transparent electrode 14 is less than 10% of the pixel size. For example, in a case where the pixel size 1 μm, for example, the opening diameter a of the opening 20 formed in the transparent electrode 14 is set to 50 nm, whereby the effect on the visibility can be decreased.

Meanwhile, the formation of the opening 20 in the transparent electrode 14 is formed through etching as described above, and accordingly, the thinning of the electrode width b is hardly limited by the manufacturing process. Accordingly, the thinning of the electrode width b can be performed. Therefore, in this embodiment, it is preferable to increase the aperture ratio of the transparent electrode 14 by appropriately changing the electrode width b in a state in which the opening diameter a of the opening 20 of the transparent electrode 14 is maintained in the range that is 1% or more and 10% or less of the pixel size. Accordingly, the transparent electrode 14 that has transmittance of 99% or more and does not have any effect on the visibility can be acquired.

In the related art, generally, ITO is used as the material of the transparent electrode 14. The transmittance of ITO is 90%, and, in a case where the transparent electrode 14 formed from ITO is formed on the upper portion of the photoelectric conversion unit PD as in JP-A-07-94699, there is loss of 10% of the transmittance. In addition, since the film thickness of the ITO film is large, the optical path changes, and there is a concern that the optical characteristics are affected. On the other hand, like this exemplary embodiment, by using graphene having the opening 20 as the transparent electrode 14, the transmittance can be set to be higher than 97.7%. In addition, since one layer of the film-shaped graphene is as thin as 0.3 nm, the optical path is not affected. Accordingly, an advantage of suppressing a dark current and the shading and the improvement of the optical characteristics can be realized altogether.

As above, by configuring the transparent electrode 14 by using graphene having the opening 20, the transparent electrode 14 can attain the role of the electrode without affecting the optical characteristics. The example in which the transparent electrode 14 is used in the solid-state imaging device 1 according to this exemplary embodiment is merely an example, and the position of the transparent electrode 14 is set in accordance with the structure of the device. Accordingly, in a solid-state imaging device in the related art, by replacing ITO used for the transparent electrode with graphene having a desired opening, the advantages similar to those of this exemplary embodiment can be acquired, and accordingly, the transmittance is improved, whereby the applicable application can be widened.

In addition, in the case illustrated in FIG. 3, although the shape of the opening 20 formed in the transparent electrode 14 is an oval shape, the shape of the opening is not limited to the oval shape and may be changed to various shapes such as a circular shape, a semicircular shape, a polygonal shape, and the like. Furthermore, in this exemplary embodiment, although an example has been described in which one layer of the transparent electrode 14 is formed, a plurality of layers of transparent electrodes may be formed so as to be stacked.

In addition, in this exemplary embodiment, although an example has been described in which graphene is used as the material of the transparent electrode 14, the present disclosure is not limited to graphene, and, for example, carbon nanotubes as the same nano carbon material may be used. In a case where target transmittance can be acquired by arranging the opening in a transparent electrode that is formed from carbon nanotubes formed in the shape of a film, the advantages similar to those of the solid-state imaging device 1 according to this exemplary embodiment can be acquired.

2. Second Embodiment

Solid-State Imaging Device

Figure 12:
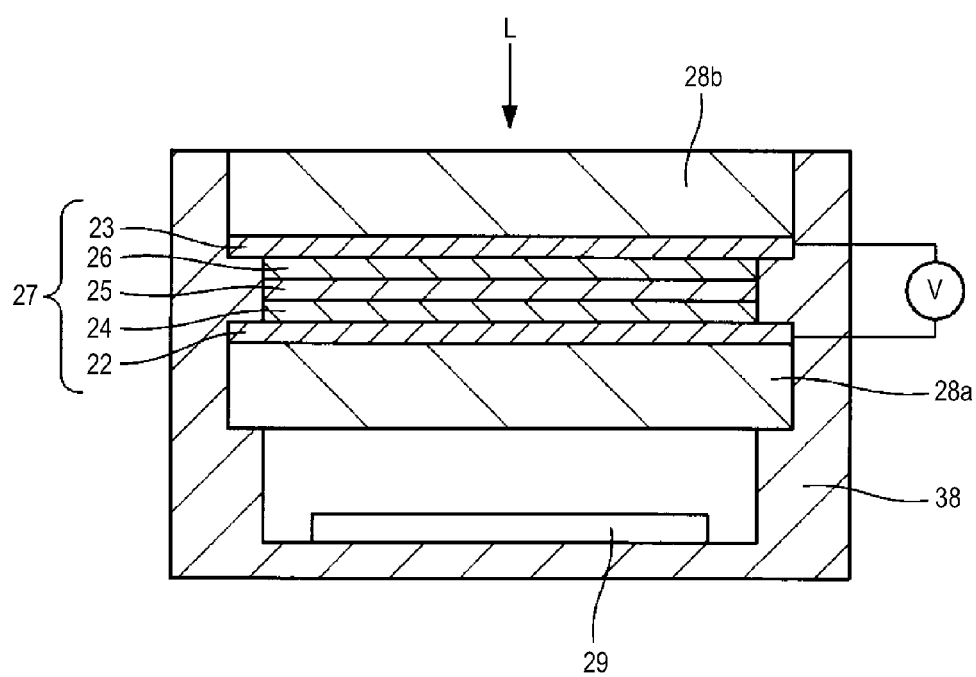
FIG. 12 is a schematic cross-sectional view illustrating the configuration of a solid-state imaging device according to a second embodiment of the present disclosure.

Next, a solid-state imaging device according to a second embodiment of the present disclosure will be described. FIG. 12 is a schematic cross-sectional view illustrating the configuration of a solid-state imaging device 21 according to this exemplary embodiment. The solid-state imaging device 21 according to this exemplary embodiment is an example in which a dimming control laminated film 27 is disposed on the light incident side of the solid-state imaging device main body 29 that is mounted inside a resin package 38.

The solid-state imaging device 21 according to this exemplary embodiment includes the solid-state imaging device main body 29 that is configured by including a plurality of photoelectric conversion units on a substrate, the resin package 38 that seals the solid-state imaging device main body 29, sealing glasses 28a and 28b, and the dimming control laminated film 27.

The resin package 38 is composed of an electrically insulating material and is configured as a casing having a shallow bottom in which a bottom portion is included on one side, and the other side is open. On the bottom face of the resin package 38, the solid-state imaging device main body 29 is disposed, and, on the opening end side thereof, the sealing glasses 28a and 28b and the dimming control laminated film 27 are formed.

Figure 13:
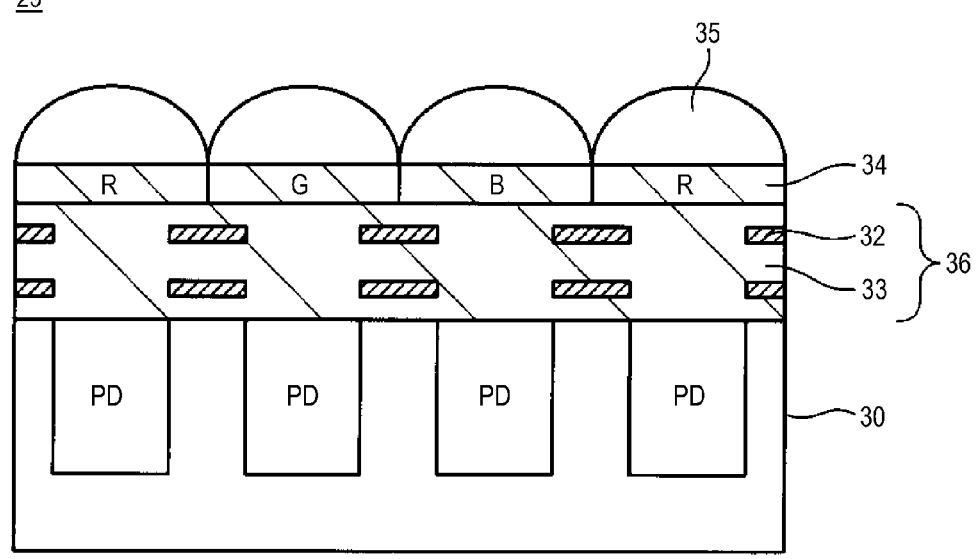
FIG. 13 is a schematic cross-sectional view illustrating the configuration of a solid-state imaging device main body illustrated in FIG. 12 in an enlarged scale.

FIG. 13 shows a schematic cross-sectional view illustrating the configuration of the solid-state imaging device main body 29 in an enlarged scale. As illustrated in FIG. 13, the solid-state imaging device main body 29 is configured to include a substrate 30 in which a plurality of photoelectric conversion units PD are formed, a wiring layer 36, a color filter layer 34, and an on-chip lens 35.

The substrate 30 is configured by a semiconductor substrate and, on the light incident side in the pixel area, a photoelectric conversion unit PD that is formed from a photodiode is formed for each pixel.

The wiring layer 36 is configured to include a plurality of (two layers in FIG. 13) layers of wirings 32 that are stacked with an interlayer insulating film 33 interposed therebetween and is formed so as to open the upper portion of the photoelectric conversion unit PD.

The color filter layer 34 is formed on an upper portion of the wiring layer 36 that is flattened, and the color filter layers 34 of R (red), G (green), and B (blue) are formed for each pixel, for example, so as to form a Bayer array. Alternatively, as the color filter layer 34, a color filter layer 34 that transmits the same color for all the pixels may be used. The combination of colors in the color filter layer can be variously selected in accordance with the specification.

The on-chip lens 35 is formed on an upper portion of the color filter layer 34 and is formed in a convex shape for each pixel. Incident light is collected by the one-chip lens 35 and incident on the photoelectric conversion unit PD of each pixel with high efficiency.

In the solid-state imaging device main body 29 having such a configuration, a connection wiring, which is not illustrated in the figure, is connected to the inside of the resin package 38 and is configured to be electrically connected to the outside of the resin package 38 through the connection wiring.

The sealing glasses 28a and 28b are configured by transparent members and are formed so as to maintain the inside of the resin package 38 to be air-tight by sealing the opening portion of the resin package 38. In addition, in an area interposed between two sealing glasses 28a and 28b, the dimming control laminated film 27 is formed.

The dimming control laminated film 27 is configured by a laminated film that is formed from a dimming control layer 24, a solid electrolyte layer 25, and an ion storing layer 26 and first and second transparent electrodes 22 and 23 that hold them therebetween and is formed on the entire upper face of the solid-state imaging device main body 29. At this time, the direction of stacking the first transparent electrode 22, the dimming control layer 24, the solid electrolyte layer 25, the ion storing layer 26, and the second transparent electrode 23 is configured to be the incidence direction of light L.

As the material of the dimming control layer 24, a magnesium compound such as Mg—Ni can be used.

As the material of the solid electrolyte layer 25, a Ta-system oxide can be used.

The ion storing layer 26 is a dimming control reacting material layer and is configured by using a so-called electrochromic material. As the material of the ion storing layer 26, representatively, a tungsten oxide can be used.

The first and second transparent electrodes 22 and 23 used in this exemplary embodiment are configured by using film-shaped graphene having a plurality of openings and have a configuration that is similar to that of the transparent electrode 14 according to the first embodiment illustrated in FIG.

3. In addition, the openings formed in the first and second transparent electrodes 22 and 23 according to this exemplary embodiment are formed so as to have an opening diameter a of about 100 nm and an electrode width of about 50 nm, and accordingly, the opening diameter a is formed to be sufficiently smaller than the pixel area. Accordingly, there is a little influence on the photoelectric conversion rate and the mobility of electrons, the contact resistance, and the like.

In this exemplary embodiment, the dimming control laminated film 27 is formed by bringing the first and second transparent electrodes 22 and 23 formed from graphene formed in the shape of a film in advance into tight contact with both sides of the laminated film that is formed from the dimming control layer 24, the solid electrolyte layer 25, and the ion storing layer 26. Then, the dimming control laminated film 27 is arranged on the upper portion of the sealing glass 28a located in the lower layer, and the sealing glass 28b is arranged from the upper portion thereof, whereby the solid-state imaging device 21 according to this exemplary embodiment can be acquired.

In addition, the dimming control laminated film 27, as illustrated in FIG. 12, is configured such that a desired voltage V can be applied between the first and second transparent electrodes 22 and 23. Although FIG. 12 schematically illustrates the connection of the voltage V, actually, it is configured such that the voltage V is applied from a wiring, which is not illustrated in the figure, formed inside the resin package 38. In the dimming control laminated film 27, by applying the voltage V between the first and second transparent electrodes 22 and 23, the ion storing layer 26 is colored in accordance with the applied voltage, whereby the transmittance of the dimming control laminated film 27 changes.

Figure 14A:
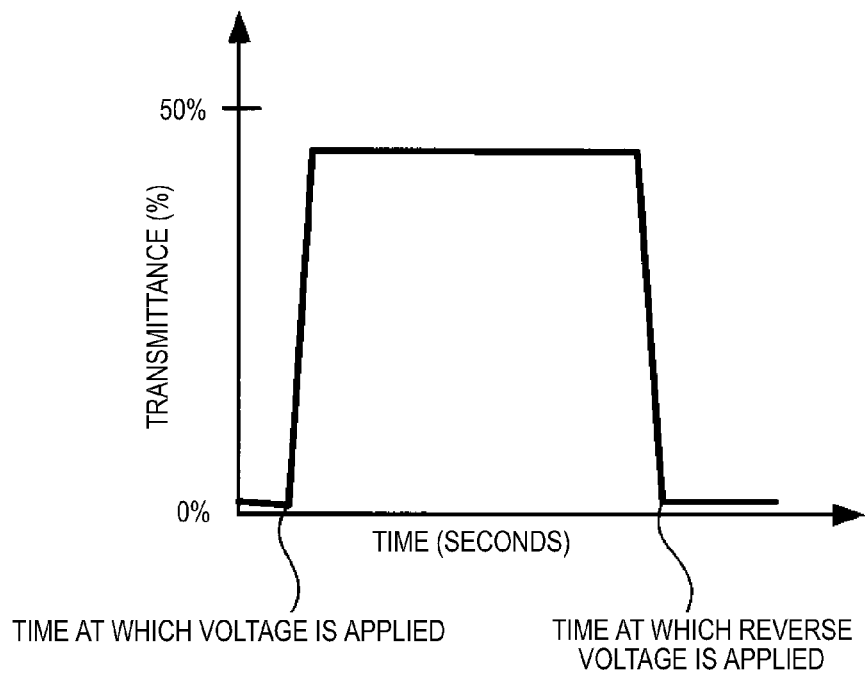
FIGS. 14A and 14B are diagrams illustrating changes in the transmittance of a dimming control laminated film with respect to an applied voltage.
Figure 14B:
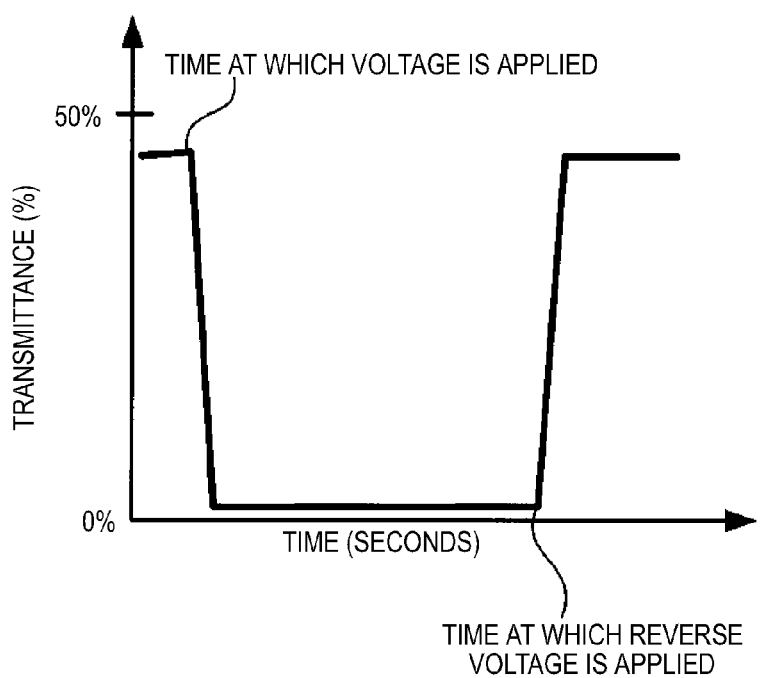

FIGS. 14A and 14B illustrate a change in the transmittance of the dimming control laminated film 27 with respect to the applied voltage V. As illustrated in FIG. 14A, when a voltage is applied at specific time, the transmittance of the dimming control laminated film 27 that has been approximately 0% instantaneously rises to a level less than 50%, and, thereafter, when an reverse voltage is applied at specific time, the transmittance that has been maintained at a level less than 50% becomes approximately 0% again. As above, in the ion storing layer 26, the speed of a change in transmittance with respect to a voltage is high, and after the change, the changed transmittance is maintained. In addition, as illustrated in FIG. 14B, the change in transmittance with respect to the voltage may be configured to be opposite to that illustrated in FIG. 14A depending on the specifications. A difference between the cases illustrated in FIGS. 14A and 14B can be changed in accordance with a method of configuring the material, and whether the transmittance rises or drops by applying a desired voltage can be determined based on the material.

Figure 15:
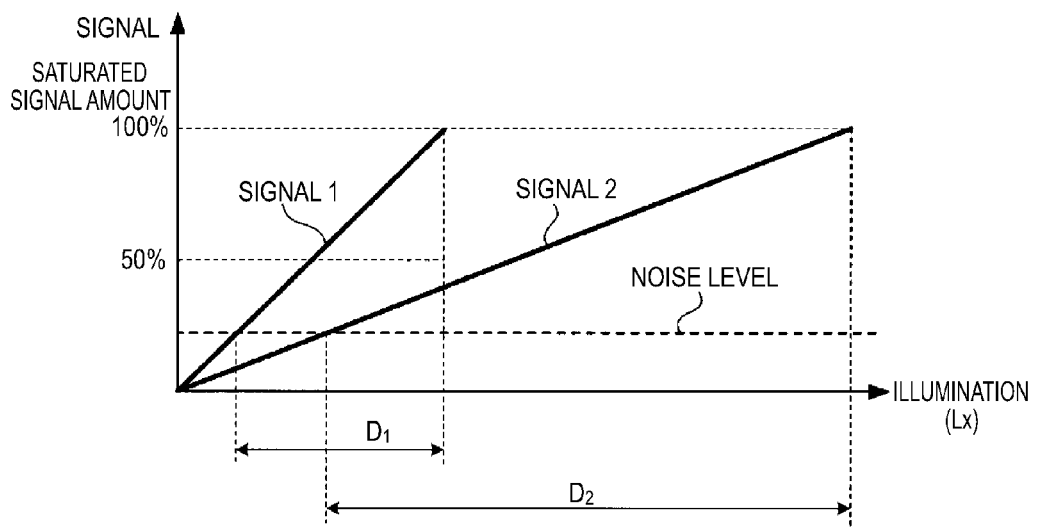
FIG. 15 is a diagram illustrating signal characteristics of an output signal in the case of high sensitivity and an output signal in the case of low sensitivity.

According to the solid-state imaging device 21 of this exemplary embodiment, by applying the desired voltage V between the first and second transparent electrodes 22 and 23, the transmittance of the dimming control laminated film 27 can be changed. Accordingly, by lowering the transmittance in a case where incident light is strong, overexposure can be prevented. In addition, according to the solid-state imaging device 21 of this exemplary embodiment, by changing the transmittance of the dimming control laminated film 27, the dynamic range can be increased. FIG. 15 is a diagram illustrating signal characteristics of an output signal 1 in the case of high sensitivity and an output signal 2 in the case of low sensitivity. In FIG. 15, the horizontal axis is the illumination, and the vertical axis is the saturated signal amount of the solid-state imaging device main body.

A line denoted by "Signal 1" illustrated in FIG. 15 is a saturation characteristic in a case where the dimming control laminated film 27 is set as high transmission, and a line denoted by "Signal 2" is a saturation characteristic in a case where the transmittance is lowered by changing the voltage V applied to the dimming control laminated film 27 from the case where Signal 1 is acquired. A signal that is used as a video output is acquired by subtracting noise from the saturated signal amount.

In a case where the transmittance of the dimming control laminated film 27 is high, the saturated charge amount is immediately reached due to high sensitivity, and a signal amount acquired in a range represented by D1 illustrated in FIG. 15 is output. On the other hand, in a case where the transmittance of the dimming control laminated film 27 is low, a signal amount acquired in a range represented by D2 (<D1) illustrated in FIG. 15 is output due to low sensitivity. In other words, by setting the low sensitivity, light of brightness in a range broader than that of the case of the high sensitivity can be acquired. Accordingly, by changing the voltage applied to the dimming control laminated film 27 in correspondence with a photographing scene, a dynamic range corresponding to the photographing scene can be acquired.

As above, according to the solid-state imaging device of this exemplary embodiment, by decreasing the transmittance by using the dimming control laminated film 27, signal charge having broad brightness can be acquired, and the dynamic range can be increased.

Figure 16:
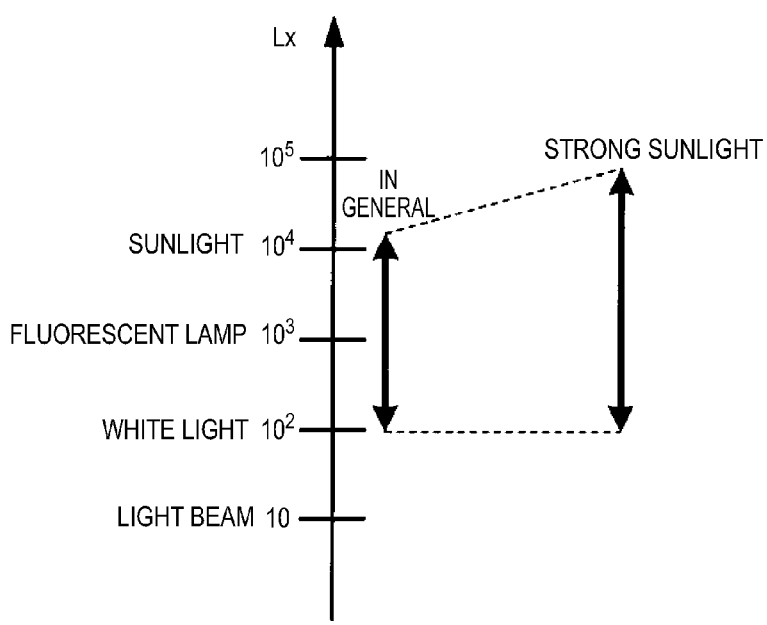
FIG. 16 is a diagram illustrating the range of illumination in which imaging can be performed.

The dynamic range is defined as the ratio of a saturated signal amount, which is the maximum signal amount to noise. In a case where white light to sunlight can be photographed by general solid-state imaging device 21 without lowering the resolution, the photographable range, as illustrated in FIG. 16, is $10^2$ to $10^4$ lux (Lx). In contrast to this, as illustrated in FIG. 16, in a case where $10^2$ to $10^5$ lux (Lx) can be photographed, the dynamic range is magnified by 10 times. When this is represented by magnification power Lb of the dynamic range, the magnification power Lb=10 log 10 A/B (dB), and A/B=10, and accordingly, the magnification power is 10 decibel (dB). Here, when the improved part x of the magnification power of the dynamic range is determined, the attained magnification power D of the dynamic range can be represented by the following Equation (4).

$$D=(1+x)Lb(\%) \quad (4)$$

Regarding the dynamic range, the improved part of the magnification power of the dynamic range=the improved part of the transmittance of the dimming control laminated film. Accordingly, when the improved part x up to the attained magnification power is determined, the opening diameter a illustrated in FIG. 3 can be determined. In other words, since the attained magnification power=the target transmittance, the opening diameter a can be acquired similarly to Equation (2). Accordingly, the openings 20 that are necessary for magnifying the dynamic range can be set for the first and second transparent electrodes 22 and 23 in accordance with the specifications demanded for each solid-state imaging device. In this exemplary embodiment, by using the first and second transparent electrodes 22 and 23 in which a plurality of the openings 20 are formed so as to have an opening diameter a of 50 nm and an electrode width b of 100 nm, an advantage of magnifying the dynamic range can be acquired.

Meanwhile, there is an example in which the dimming control laminated film is configured by using ITO as a transparent electrode in the related art. However, in a case where ITO is used for the transparent electrode, a 10% loss of transmittance occurs for one layer. Thus, in a case where two layers of ITO are used on both sides, a 20% loss of the transmittance occurs. The improvement of the transmittance directly influences the improvement of the sensitivity. Accordingly, for example, in the solid-state imaging device, the loss of the transmittance results in a decrease in the magnification of the dynamic range.

On the other hand, according to the solid-state imaging device 21 of this exemplary embodiment, by using film-shaped graphene as the first and second transparent electrodes 22 and 23 used in the dimming control laminated film 27, the dynamic range can be magnified without decreasing the sensitivity. In addition, various changes such as the sizes and the formation positions of the openings 20 of the first and second transparent electrodes 22 and 23 can be changed in accordance with a characteristic desired to be realized and restrictions.

In addition, according to this exemplary embodiment, although both the first and second transparent electrodes 22 and 23 that form the dimming control laminated film 27 are configured by using graphene as an example, a configuration may be employed as an example in which at least one of them is configured by using a film-shaped material formed from graphene. Even in such a case, the transmittance can be higher than that of a dimming control laminated film using a transparent electrode that is formed from an ITO film as in the related art.

3. Third Embodiment

Solid-State Imaging Device

Figure 17:
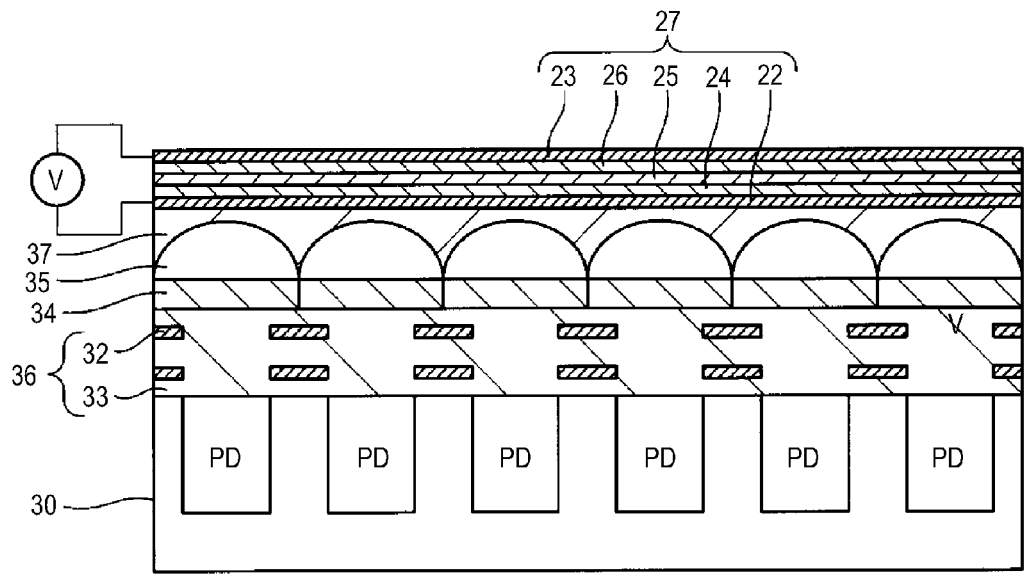
FIG. 17 is a schematic cross-sectional view illustrating the configuration of a main portion of a solid-state imaging device according to a third embodiment of the present disclosure.

Next, a solid-state imaging device according to a third embodiment of the present disclosure will be described. FIG. 17 is a schematic cross-sectional view illustrating the configuration of a main portion of a solid-state imaging device 40 according to this exemplary embodiment. Although the solid-state imaging device 40 illustrated in FIG. 17 corresponds to the solid-state imaging device main body 29 illustrated in FIG. 12, it will be described as the solid-state imaging device here (this applies similarly to the following embodiments). The solid-state imaging device 40 of this exemplary embodiment is an example in which a dimming control laminated film 27 is provided immediately above an on-chip lens 35. In FIG. 17, the same reference numeral is assigned to a portion corresponding to FIG. 12, and duplicate description thereof will not be repeated.

As illustrated in FIG. 17, in the solid-state imaging device 40 according to this exemplary embodiment, the dimming control laminated film 27 is formed on the upper portion of the on-chip lens 35 through a flattening film 37. The dimming control laminated film 27 is configured by a laminated film that is formed from a dimming control layer 24, a solid electrolyte layer 25, and an ion storing layer 26 and first and second transparent electrodes 22 and 23 that hold them therebetween. At this time, the direction of stacking the first transparent electrode 22, the dimming control layer 24, the solid electrolyte layer 25, the ion storing layer 26, and the second transparent electrode 23 is configured to be the incidence direction of light. The configuration of the dimming control laminated film 27 is similar to that of the dimming control laminated film 27 according to the second embodiment, and a material and a configuration similar to those thereof may be used.

Also in this exemplary embodiment, by applying a desired voltage V between the first and second transparent electrodes 22 and 23, the transmittance of the dimming control laminated film 27 can be changed. Accordingly, similarly to the second embodiment, the dynamic range can be magnified. In addition, according to the solid-state imaging device 40 of this exemplary embodiment, the dimming control laminated film 27 is formed immediately above the on-chip lens 35, and accordingly, the magnification power is lower than that of the solid-state imaging device 21 according to the second embodiment, whereby the device can be miniaturized.

In addition, the advantages similar to those of the first and second embodiments can be acquired.

Furthermore, in the solid-state imaging device 40 of this exemplary embodiment, it is necessary to form a difference in the refractive indices of the on-chip lens 35 and the first transparent electrode 22 that is formed on the upper portion thereof or to arrange an air layer between the on-chip lens 35 and the first transparent electrode 22. Although not illustrated in FIG. 17, actually, the dimming control laminated film 27 is formed on the upper portion of the flattening film 37 located on the upper portion of the on-chip lens 35 through an air layer. In the solid-state imaging device 40 of this exemplary embodiment, as illustrated in FIG. 12, is arranged inside a resin package and is sealed by sealing glasses.

4. Fourth Embodiment

Solid-State Imaging Device

Figure 18:
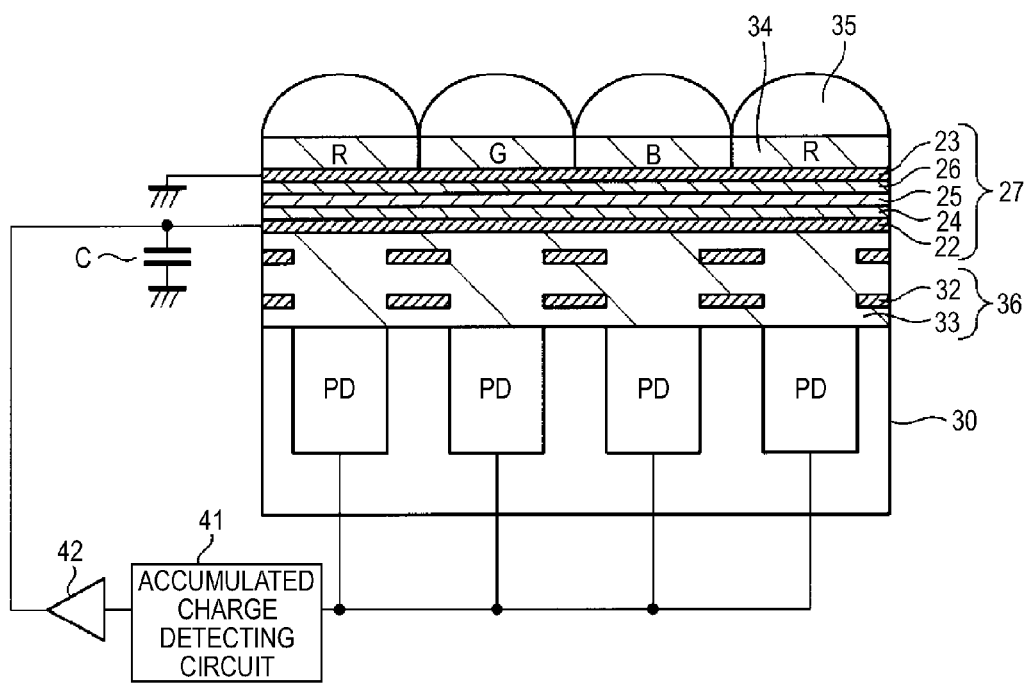
FIG. 18 is a schematic cross-sectional view illustrating the configuration of a main portion of a solid-state imaging device according to a fourth embodiment of the present disclosure.

Next, a solid-state imaging device according to a fourth embodiment of the present disclosure will be described. FIG. 18 is a schematic cross-sectional view illustrating the configuration of a main portion of a solid-state imaging device 50 according to this exemplary embodiment. The solid-state imaging device 50 of this exemplary embodiment is an example in which a dimming control laminated film 27 is formed in a lower layer of a color filter layer 34. In FIG. 18, the same reference numeral is assigned to a portion corresponding to FIG. 17, and duplicate description thereof will not be repeated.

As illustrated in FIG. 18, in the solid-state imaging device 50 according to this exemplary embodiment, the dimming control laminated film 27 is formed between a wiring layer 36 formed on the light emission side of a substrate 30 and a color filter layer 34. The dimming control laminated film 27 is configured by a laminated film that is formed from a dimming control layer 24, a solid electrolyte layer 25, and an ion storing layer 26 and first and second transparent electrodes 22 and 23 that hold them therebetween. At this time, the direction of stacking the first transparent electrode 22, the dimming control layer 24, the solid electrolyte layer 25, the ion storing layer 26, and the second transparent electrode 23 is configured to be the incidence direction of light. The configuration of the dimming control laminated film 27 is similar to that of the dimming control laminated film 27 according to the second embodiment, and a material and a configuration similar to those thereof may be used.

Figure 19:
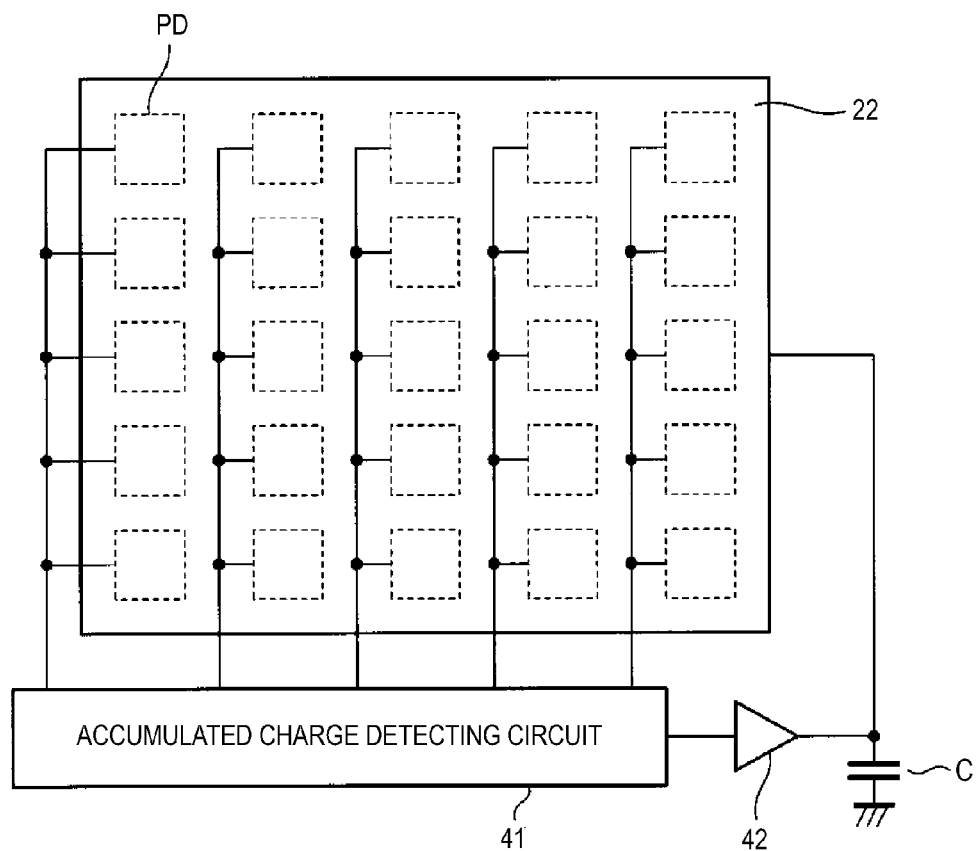
FIG. 19 illustrates a planar configuration of a first transparent electrode with respect to photoelectric conversion units, according to the fourth embodiment of the present disclosure.

FIG. 19 illustrates a planar configuration of the first transparent electrode 22 with respect to photoelectric conversion units PD, according to this exemplary embodiment. As illustrated in FIG. 19, the first transparent electrode 22 that configures the dimming control laminated film 27 is formed on the entire face of the pixel area so as to cover the photoelectric conversion units PD located in the pixel area.

In the dimming control laminated film 27 of this exemplary embodiment, the first transparent electrode 22 is connected to an accumulated charge detecting circuit 41, which detects signal charge generated and accumulated by the photoelectric conversion unit PD, through an amplifier circuit 42. The signal charge that is generated and accumulated by the photoelectric conversion unit PD of each pixel is transferred to the accumulated charge detecting circuit 41. In the accumulated charge detecting circuit 41, the amount of the detected signal charge is converted into an electric potential, and the electric potential is applied to the first transparent electrode 22 through the amplifier circuit 42 via an output wiring. In this exemplary embodiment, electric potentials that are based on the amounts of signal charge transferred from the photoelectric conversion units PD of all the pixels to the accumulated charge detecting circuit 41 are configured to be output from the accumulated charge detecting circuit 41 to the first transparent electrode 22. In addition, between the amplifier circuit 42 and the first transparent electrode 22, a voltage maintaining capacitor C of which one terminal is grounded is connected. Furthermore, the second transparent electrode 23 is grounded.

According to such a configuration, in the solid-state imaging device 50 of this exemplary embodiment, an electric potential that is based on the amount of signal charge generated and accumulated by the photoelectric conversion unit PD is supplied to the first transparent electrode 22. Then, the transmittance of the dimming control laminated film 27 is configured to be adjusted in accordance with the supplied electric potential. For example, in a case where strong light is incident, the transmittance of the dimming control laminated film 27 is configured to decrease based on the signal output. Accordingly, the magnification of the dynamic range is achieved, and additionally advantages that are similar to those of the first to third embodiments can be acquired.

Figure 20:
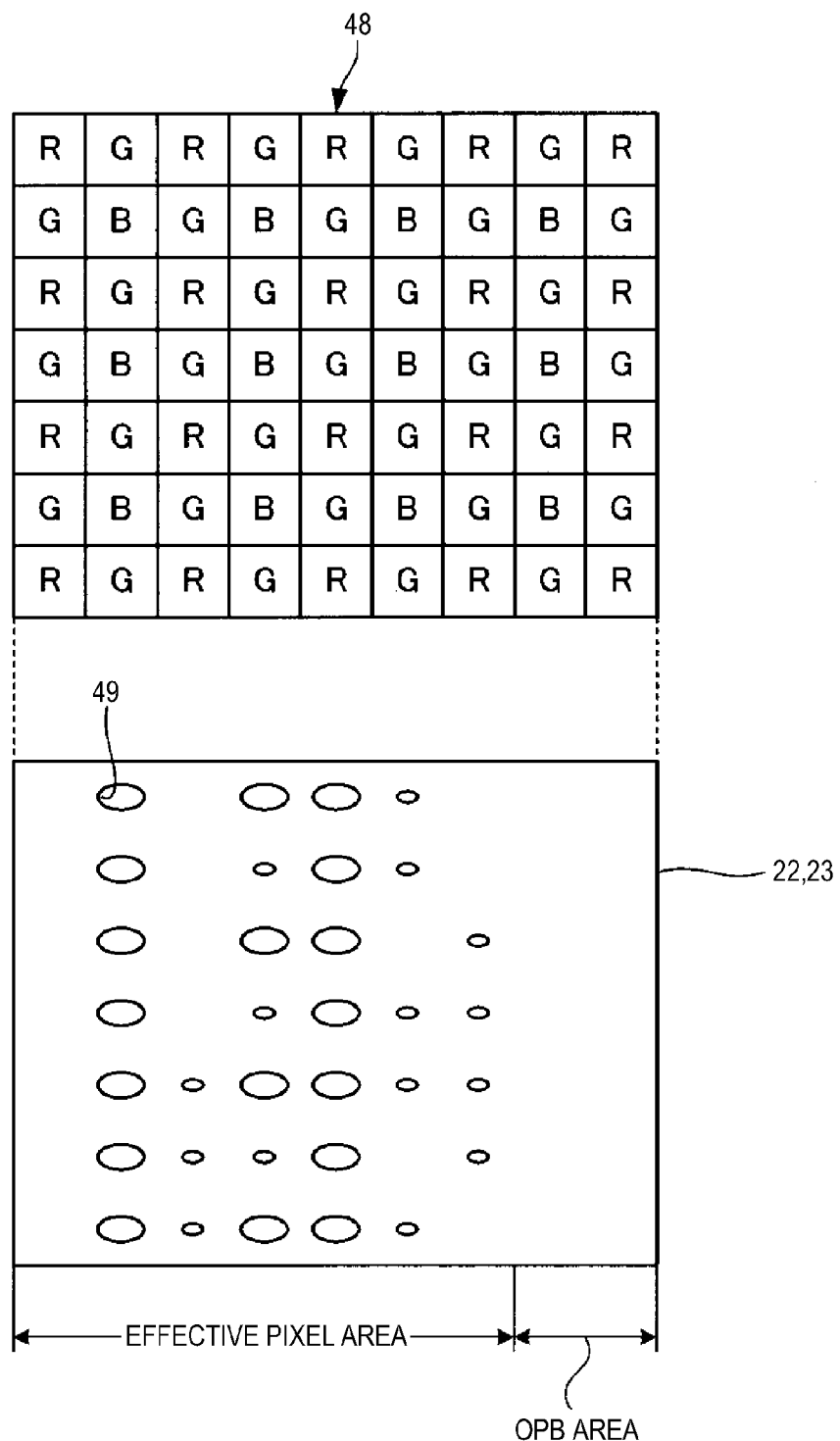
FIG. 20 is a schematic plan view illustrating the configuration of a modified example of first and second transparent electrodes of a dimming control laminated film according to the fourth embodiment of the present disclosure.

In the solid-state imaging device 50 of this exemplary embodiment, an example has been described in which the configuration of the first and second transparent electrodes 22 and 23 is similar to that illustrated in FIG. 17. However, the size and the formation position of the opening 20 may be variously changed. FIG. 20 illustrates a planar configuration of a modified example of the first and second transparent electrodes 22 and 23 of the dimming control laminated film 27. In FIG. 20, the planar layout of a pixel area 48 and the configuration of the first and second transparent electrodes 22 and 23 corresponding thereto are illustrated in parallel with each other. As illustrated in FIG. 20, in the first and second transparent electrodes 22 and 23 according to the modified example, opening portions 49 having different opening diameters for each pixel are formed, and the electrode widths are different for each pixel. In addition, any opening is not formed in an optical black pixel area (OPB pixel area) that is formed on the outer side of an effective pixel area.

As above, in the OPB pixel area that is commonly covered with a light shielding film and is light-shielded so as to output a black reference signal, it is not necessary to transmit light, and accordingly, any opening may not be formed in the transparent electrodes. As above, in the OPB pixel area, by not arranging any opening in the first and second transparent electrodes 22 and 23, the accuracy of the output of the black reference signal can be improved.

5. Fifth Embodiment

Solid-State Imaging Device

Figure 21:
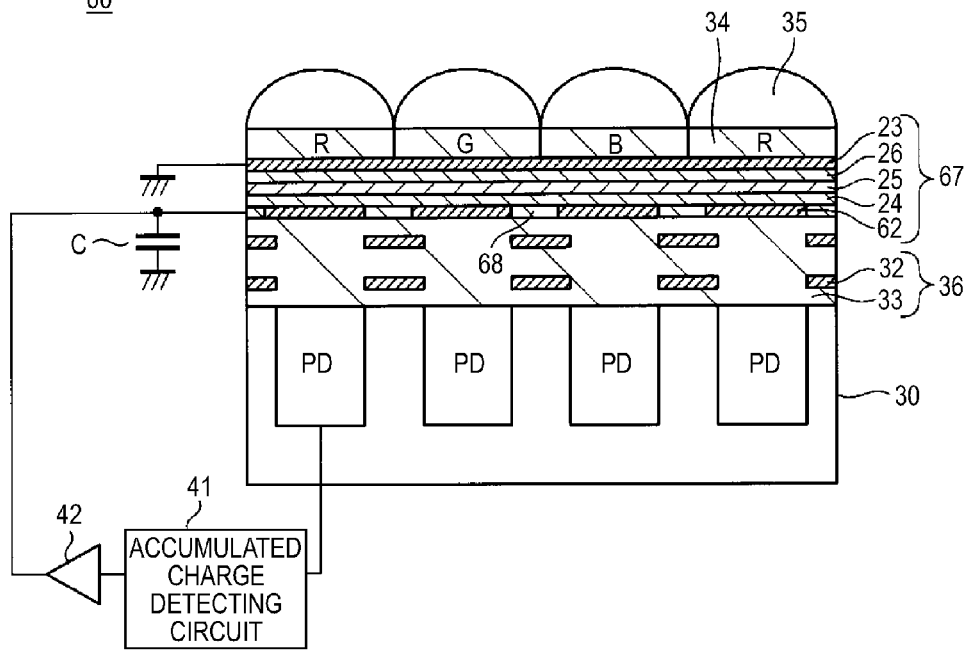
FIG. 21 is a schematic cross-sectional view illustrating the configuration of a main portion of a solid-state imaging device according to a fifth embodiment of the present disclosure.

Next, a solid-state imaging device according to a fifth embodiment of the present disclosure will be described. FIG. 21 is a schematic cross-sectional view illustrating the configuration of a main portion of a solid-state imaging device 60 according to this exemplary embodiment. The solid-state imaging device 60 of this exemplary embodiment is an example in which the first transparent electrode 22 is patterned so as to be able to change the transmittance for each pixel in the solid-state imaging device 50 according to the fourth embodiment. In FIG. 21, the same reference numeral is assigned to a portion corresponding to FIG. 18, and duplicate description thereof will not be repeated.

As illustrated in FIG. 21, according to the solid-state imaging device 60 of this exemplary embodiment, first transparent electrodes 62 of a dimming control laminated film 67 that are located on a side electrically connected to an accumulated charge detecting circuit 41 connected to a photoelectric conversion unit PD of each pixel are formed to be separated for each pixel. On the other hand, a second transparent electrode 23 that is applied with the ground electric potential is formed to be common to all the pixels. The separated first transparent electrodes 62 of the solid-state imaging device 60 can be formed by separating them through patterning for each pixel. Between the first transparent electrode 62 that is separately formed and the first transparent electrode 62 adjacent thereto, an insulating film 68 is buried.

Figure 22:
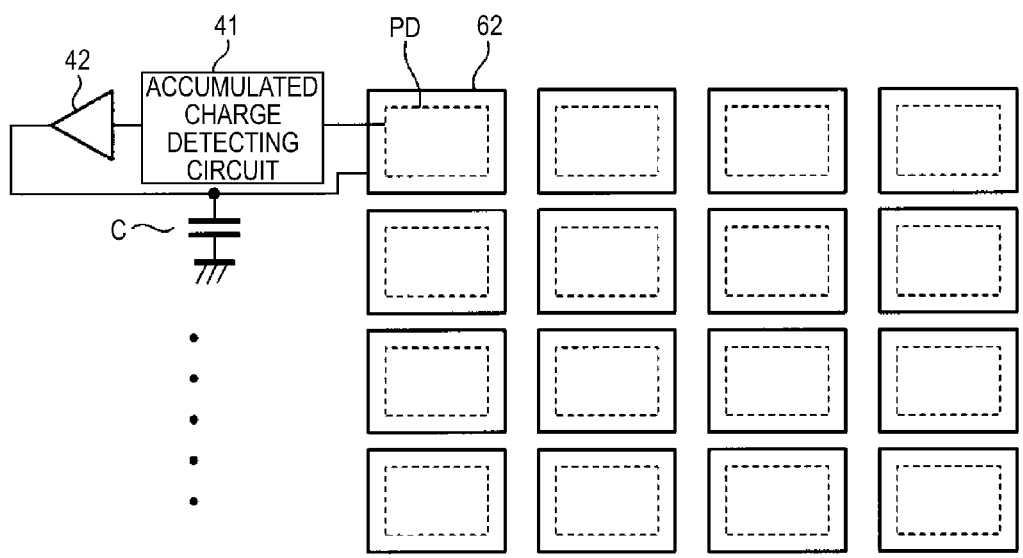
FIG. 22 is a diagram illustrating the relation between first transparent electrodes of the solid-state imaging device according to the fifth embodiment of the present disclosure and an accumulated charge detecting circuit connected thereto.

FIG. 22 is a diagram illustrating the relation between the first transparent electrodes 62, which are formed in correspondence with the photoelectric conversion unit PD of each pixel, of the solid-state imaging device 60 according to this exemplary embodiment and the accumulated charge detecting circuit 41 connected thereto. As illustrated in FIG. 22, the first transparent electrode 62 is formed for each photoelectric conversion unit PD arranged in R, G, and B, and each first transparent electrode 62 is formed to have a size for completely covering the upper portion of the corresponding photoelectric conversion unit PD. In addition, the accumulated charge detecting circuit 41 that is connected to each photoelectric conversion unit PD is connected to each first transparent electrode 62 corresponding to each photoelectric conversion unit PD.

According to this exemplary embodiment, information of signal charge accumulated in the photoelectric conversion unit PD is transmitted to the first transparent electrode 62 for each pixel, and the electric potential that is applied to the first transparent electrode 62 is determined based on the information. Accordingly, the transmittance of the dimming control laminated film 67 can be changed for each pixel, and therefore, the image quality having higher accuracy can be acquired.

In addition, advantages that are similar to those of the first to fourth embodiments can be acquired.

Figure 23:
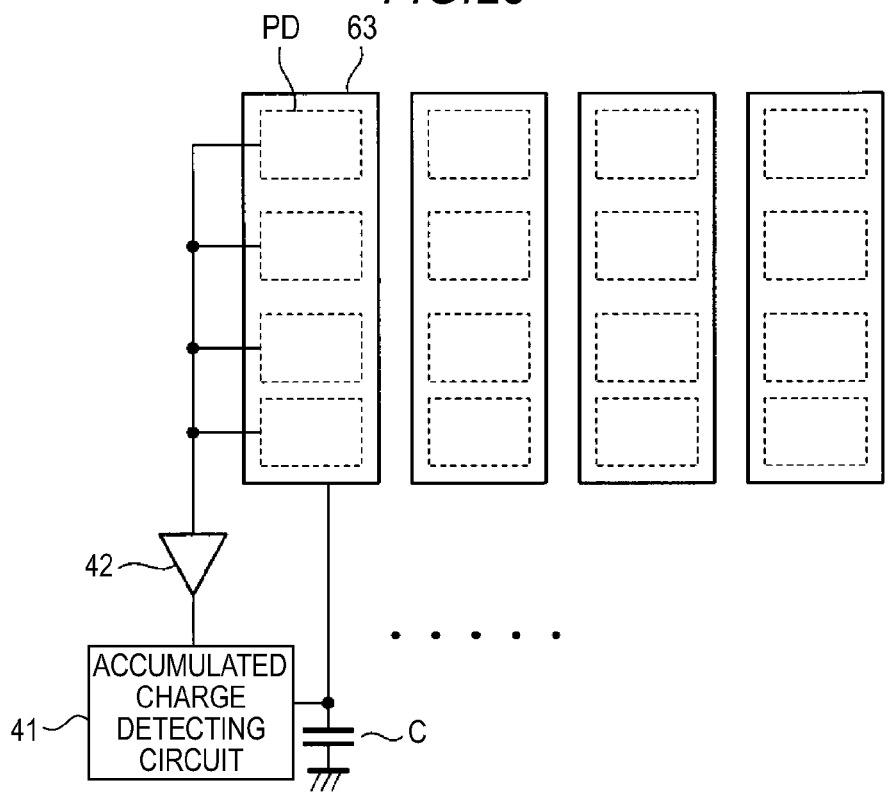
FIG. 23 is a diagram illustrating the relation between a first transparent electrode of a solid-state imaging device according to a modified example and an accumulated charge detecting circuit connected thereto.

In this exemplary embodiment, although an example has been described in which the first transparent electrode 62 is formed for each photoelectric conversion unit PD in correspondence with the photoelectric conversion unit PD of each pixel, an example may be employed in which the first transparent electrode is formed in correspondence with each pixel row. FIG. 23 illustrates the relation between first transparent electrode 63 that are formed in correspondence with the photoelectric conversion unit PD for each column and the accumulated charge detecting circuit 41 connected thereto as a modified example of the solid-state imaging device 60 of this exemplary embodiment.

In the example illustrated in FIG. 23, for each column of the photoelectric conversion units PD arranged in R, G, and B, the first transparent electrode 63 is formed, and each first transparent electrode 63 is formed in each column in a size for completely covering the corresponding photoelectric conversion units PD. In addition, the accumulated charge detecting circuit 41 connected to the photoelectric conversion units PD formed for each column is connected to the first transparent electrode 63 corresponding to each photoelectric conversion unit PD.

According to this exemplary embodiment, information of signal charge accumulated in the photoelectric conversion units PD for each column is transmitted to the first transparent electrode 63 for each pixel row, and the electric potential that is applied to the first transparent electrode 63 is determined based on the information. Accordingly, the transmittance of the dimming control laminated film 67 can be changed for each pixel row.

As above, the examples of the patterning of the first transparent electrodes are not limited to each pixel or each pixel row, and various changes can be made therein.

Figure 24:
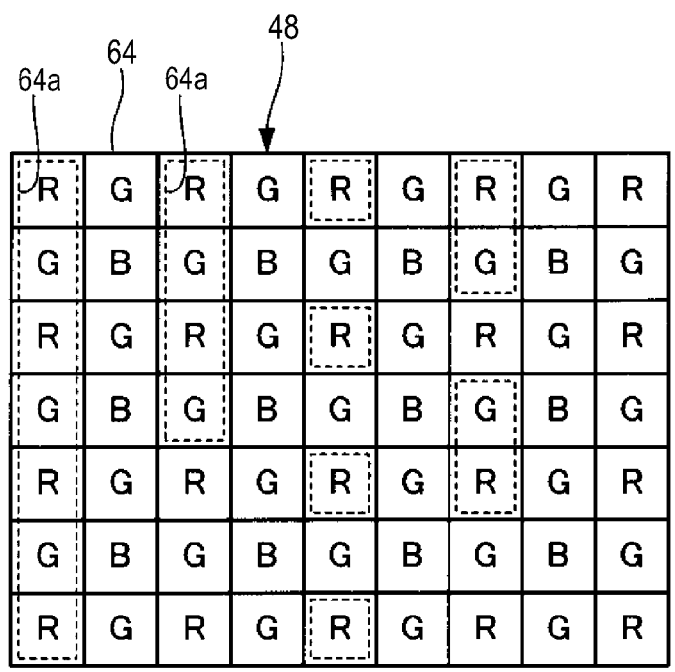
FIG. 24 is a configuration diagram in a case where the first transparent electrodes are formed irregularly with respect to a pixel area.

FIG. 24 is a configuration diagram in a case where the first transparent electrodes 64 are formed irregularly with respect to the pixel area 48 in this exemplary embodiment. In FIG. 24, opening portions 64a are irregularly formed with respect to the first transparent electrodes 64, and, in a portion corresponding to each opening portion 64a, a dimming control laminated film is not configured. As above, a configuration may be employed in which the irregular opening portions 64a are formed in the first transparent electrodes 64 so as to improve the characteristics of pixels.

In this exemplary embodiment, the patterning of the first transparent electrodes 62 may be variously changed. In addition, in this exemplary embodiment, although an example has been described in which the second transparent electrode 23 is common to all the pixels, the second transparent electrode 23 side may be formed so as to be separated for each pixel or each pixel row as well.

6. Sixth Embodiment

Solid-State Imaging Device

Figure 25:
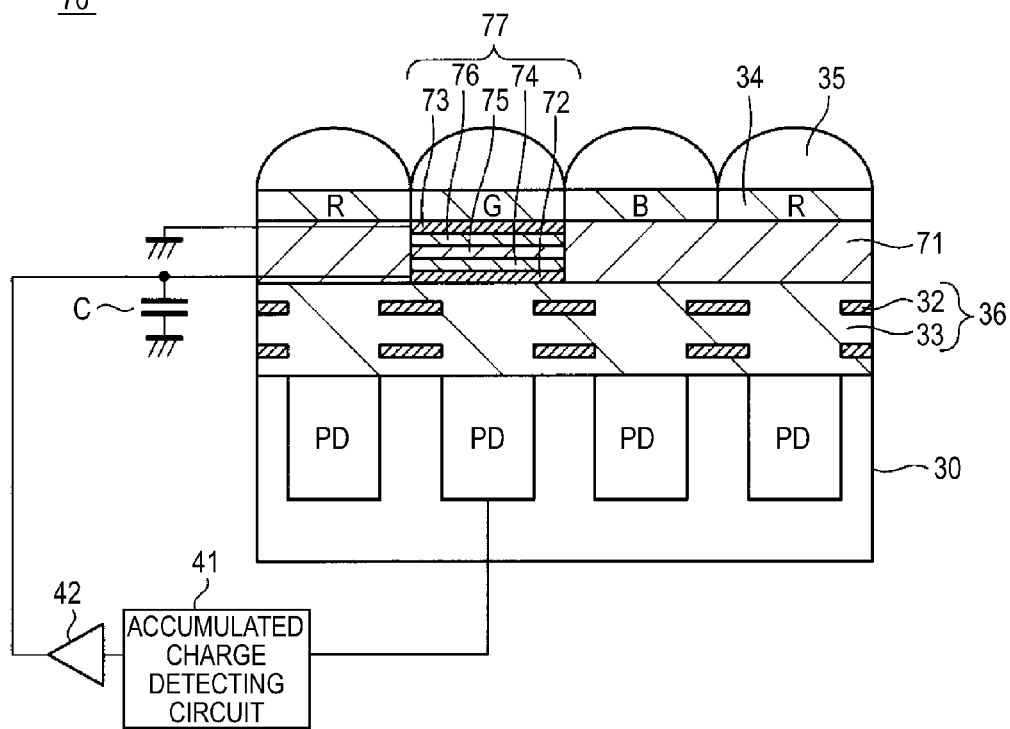
FIG. 25 is a schematic cross-sectional view illustrating the configuration of a main portion of a solid-state imaging device according to a sixth embodiment of the present disclosure.

Next, a solid-state imaging device according to a sixth embodiment of the present disclosure will be described. FIG. 25 is a schematic cross-sectional view illustrating the configuration of a main portion of a solid-state imaging device 70 according to this exemplary embodiment. The solid-state imaging device 70 of this exemplary embodiment is an example in which the dimming control laminated film is formed only for green pixels in the fourth embodiment.

As illustrated in FIG. 25, in the solid-state imaging device 70 according to this exemplary embodiment, the dimming control laminated film 77 is configured by a laminated film that is formed from a first transparent electrode 72, a dimming control layer 74, a solid electrolyte layer 75, and an ion storing layer 76 and a second transparent electrode 73. In such as the material of the dimming control laminated film 77, the same material as that of the dimming control laminated film 27 in the fourth embodiment can be used. In this exemplary embodiment, the dimming control laminated film 77 is formed only in a lower layer of a green color filter layer 34.

To the first transparent electrode 72 that configures the dimming control laminated film 77, an accumulated charge detecting circuit 41 of the photoelectric conversion unit PD corresponding to the pixel is connected.

In addition, according to this exemplary embodiment, in a pixel in which the dimming control laminated film 77 is not formed, in the upper portion of a wiring layer 36, a resin layer 71 that transmits light is formed to be embedded so as to embed a level difference of the dimming control laminated film 77. As the material of the resin layer 71, a polystyrene-system resin or an acrylic resin may be used. Accordingly, a height difference between a portion in which the dimming control laminated film 77 is formed and a portion in which the diming control laminated film 77 is not formed is decreased, whereby the face on which the color filter layer 34 is formed is flattened.

Figure 26:
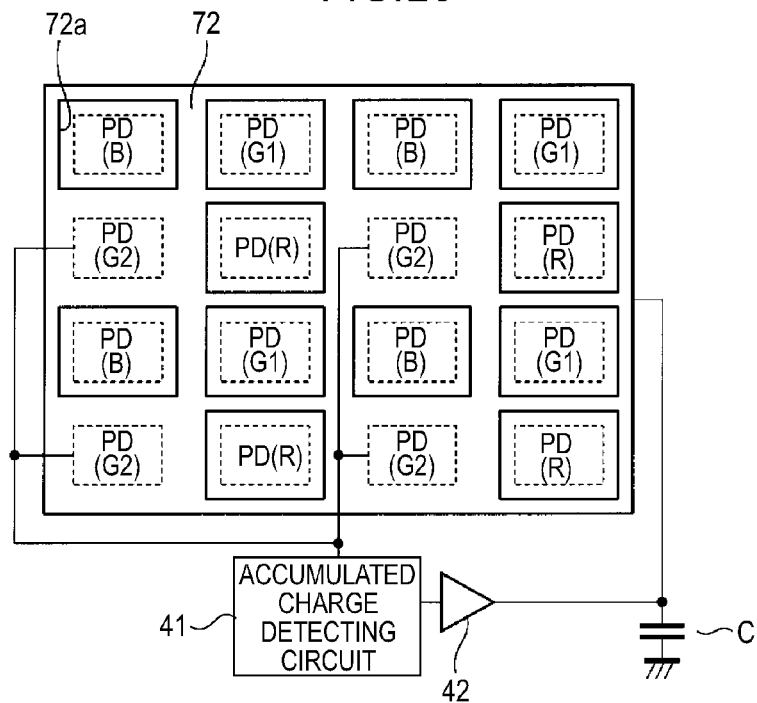
FIG. 26 is a diagram illustrating the relation between a first transparent electrode of the solid-state imaging device according to the sixth embodiment of the present disclosure and an accumulated charge detecting circuit connected thereto.

FIG. 26 is a diagram illustrating the relation between the first transparent electrode 72 of the solid-state imaging device 70 according to this exemplary embodiment that is formed in correspondence with the photoelectric conversion unit PD for each pixel and the accumulated charge detecting circuit 41 connected thereto. In the solid-state imaging device 70 according to this exemplary embodiment, pixels of RGB are arranged in a Bayer array, and, on the upper portion of only one photoelectric conversion unit PD(G2) out of two photoelectric conversion units PD(G1) and PD(G2) that performs photoelectric conversion of green light, the first transparent electrode 72 is formed. In addition, in the other pixels, the photoelectric conversion units PD are open. Furthermore, the first transparent electrode 72 that covers only the photoelectric conversion unit PD (G2) is electrically connected to the entire face of the pixel area.

Although the second transparent electrode 73 is not illustrated in the figure, it is configured in the same shape as that of the first transparent electrode 72. The second transparent electrode may be formed so as to cover the entire face of the pixel area, and the shape thereof may be variously changed.

According to the solid-state imaging device 70 of this exemplary embodiment, since the transmittance of the dimming control laminated film 77 is changed in one green pixel, a high-sensitive green pixel and a low-sensitive green pixel can be disposed, whereby the dynamic range is magnified. As in this exemplary embodiment, by changing not the exposure time but the sensitivity, the dynamic range is magnified, whereby an artifact that remains when a moving subject is photographed can be prevented.

In addition, advantages that are similar to those of the first to fifth embodiments can be acquired.

7. Seventh Embodiment

Solid-State Imaging Device

Figure 27:
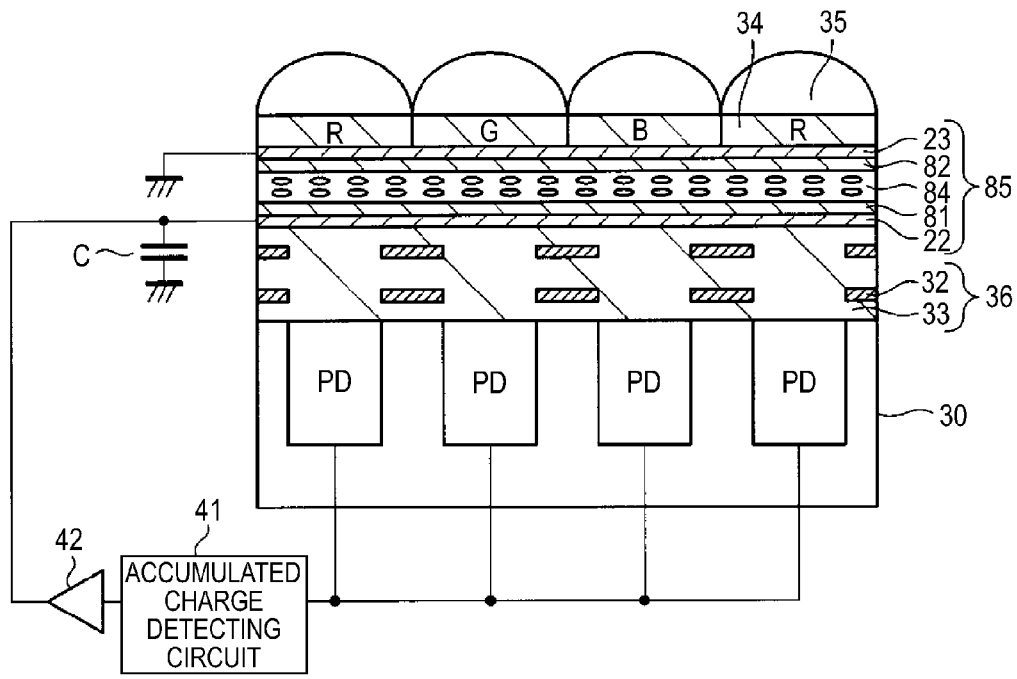
FIG. 27 is a schematic cross-sectional view illustrating the configuration of a main portion of a solid-state imaging device according to a seventh embodiment of the present disclosure.

Next, a solid-state imaging device according to a seventh embodiment of the present disclosure will be described. FIG. 27 is a schematic cross-sectional view illustrating the configuration of a main portion of a solid-state imaging device 80 according to this exemplary embodiment. The solid-state imaging device 80 of this exemplary embodiment is an example in which a liquid crystal layer is used as the dimming control reacting material of the dimming control laminated film 27 in the solid-state imaging device 50 according to the fourth embodiment. In FIG. 27, the same reference numeral is assigned to a portion corresponding to FIG. 18, and duplicate description thereof will not be repeated.

In the dimming control laminated film 85 of this exemplary embodiment, the liquid crystal layer 84 is formed between a first transparent electrode 22 and a second transparent electrode 23. In addition, on the sides of the first transparent electrode 22 and the second transparent electrode 23 that are brought into contact with the liquid crystal layer 84, oriented films 81 and 82 that determine the orientation of the liquid crystal are formed.

As the liquid crystal that configures the liquid crystal layer 84, a liquid crystal that is commonly used can be used. The orientation is changed in accordance with an electric potential applied between the first transparent electrode 22 and the second transparent electrode 23. Since the transmittance is changed by changing the orientation of the liquid crystal layer 84, light transmitted through the photoelectric conversion unit PD can be adjusted.

Also in this embodiment, the transmittance of the dimming control laminated film 85 is changed based on a signal accumulated in the photoelectric conversion unit PD. Accordingly, the dynamic range is magnified, and advantages similar to those of the first to sixth embodiments can be acquired.

In addition, also in this exemplary embodiment, as illustrated in FIGS. 22, 23, and 26, the first transparent electrodes 22 may be formed so as to be separated for each pixel, for each pixel row, or the like, and various changes can be made therein.

8. Eighth Embodiment

Solid-State Imaging Device

Figure 28:
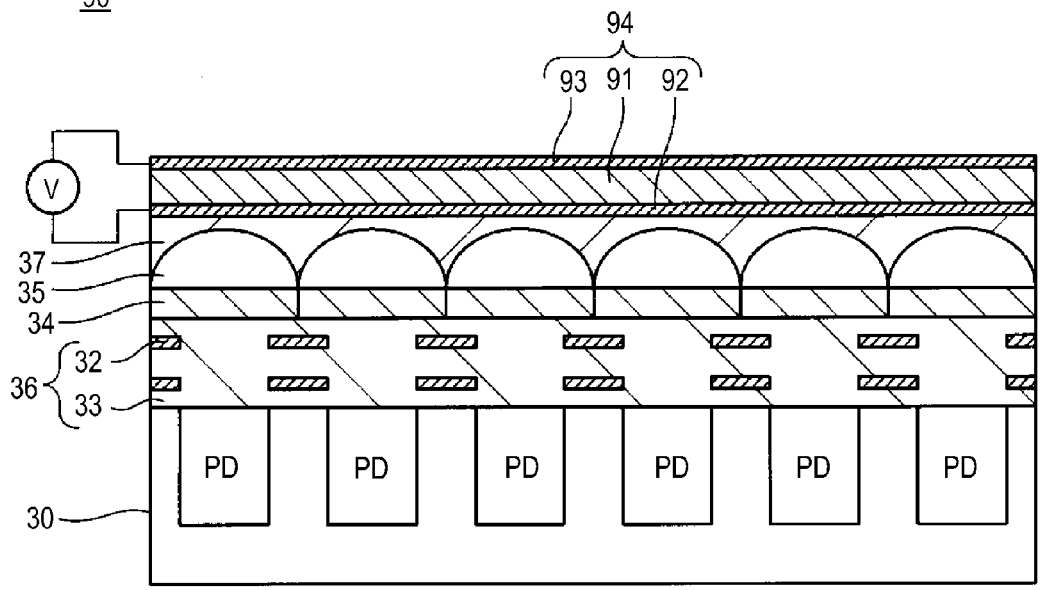
FIG. 28 is a schematic cross-sectional view illustrating the configuration of a main portion of a solid-state imaging device according to an eighth embodiment of the present disclosure.

Next, a solid-state imaging device according to an eighth embodiment of the present disclosure will be described. FIG. 28 is a schematic cross-sectional view illustrating the configuration of a main portion of a solid-state imaging device 90 according to this exemplary embodiment. The solid-state imaging device 90 of this exemplary embodiment is an example in which a photoelectric conversion layer 94 that includes an organic photoelectric conversion film 91 is formed on an upper portion of an on-chip lens 35. In FIG. 28, the same reference numeral is assigned to a portion corresponding to FIG. 17, and duplicate description thereof will not be repeated.

As illustrated in FIG. 28, according to the solid-state imaging device 90 of this exemplary embodiment, the photoelectric conversion layer 94 is formed on the upper portion of the on-chip lens 35 through a flattening film 37. The photoelectric conversion layer 94 is configured by an organic photoelectric conversion film 91 and first and second transparent electrodes 92 and 93 that hold the organic photoelectric conversion film 91 therebetween. At this time, the direction of stacking of the first transparent electrode 92, the organic photoelectric conversion film 91, and the second transparent electrode 93 are configured to be the incident direction of light, and the photoelectric conversion layer 94 is formed on the entire face of the pixel area of the solid-state imaging device 90.

The first and second transparent electrodes 92 and 93 have a configuration that is similar to that of the transparent electrodes of the second embodiment. In addition, according to this exemplary embodiment, the first transparent electrodes 92, similarly to the case illustrated in FIG. 22, are formed so as to be separated for each pixel, and the second transparent electrode 93 is formed so as to be common to the entire face of the pixel area.

In addition, the organic photoelectric conversion film 91 is configured by using a material that can be photoelectrically converted in accordance with light of green and is formed by using an organic material such as rhodamine-based dye, merocyanine-based dye, or quinacridone.

Furthermore, in this embodiment, a color filter layer 34 that transmits light of red (R) and a color filter layer 34 that transmits light of blue (B) are alternately arranged.

In the solid-state imaging device 90 of this exemplary embodiment, since the photoelectric conversion layer 94 that can perform photoelectric conversion of green light is formed on the upper portion of the on-chip lens 35, the green light is photoelectrically converted by the organic photoelectric conversion film 91. Accordingly, signal charge corresponding to the green light is output from the first and second transparent electrodes 92 and 93. The red light and blue light transmitted through the photoelectric conversion layer 94 are incident through the color filter layer 34 of each pixel and are photoelectrically converted by the photoelectric conversion unit PD formed from a photodiode inside the substrate 30. In other words, according to the solid-state imaging device 90 of this exemplary embodiment, green light having a middle wavelength is configured to be acquired by the organic photoelectric conversion film 91, and blue light having a short wavelength and red light having a long wavelength are configured to be acquired by the photoelectric conversion unit PD located inside the substrate 30.

In addition, according to the solid-state imaging device 90 of this exemplary embodiment, since the first and second transparent electrodes 92 and 93 are configured by using film-shaped graphene that has openings, the transmittance can be configured to be higher than that of a case where the transparent electrode in the related art such as ITO is used. Accordingly, the sensitivity is improved. Furthermore, according to the solid-state imaging device 90 of this exemplary embodiment, a signal of green light can be acquired by the photoelectric conversion layer 94 that is located on the upper portion of the substrate 30, and signals of the other colors can be acquired by the substrate 30, whereby the use efficiency of light is improved.

In this exemplary embodiment, since green light having a middle wavelength is configured to be photoelectrically converted by the organic photoelectric conversion film 91, red light and blue light that is photoelectrically converted inside the substrate 30 have the wavelength regions separated away from each other, whereby a mixed color can be reduced. In this embodiment, an example has been described in which green light is photoelectrically converted by the organic photoelectric conversion film 91, red light or blue light other than the green light may be configured to be photoelectrically converted by the organic photoelectric conversion film 91. Such a case can be realized by changing the material of the organic photoelectric conversion film 91.

In addition, as examples of the material of the organic photoelectric conversion film 91, there are pentacene and derivatives thereof (TIPS-pentacene and the like), naphthacene and derivatives thereof (rubrene and hexapropylnaphthacene), thiophene and derivatives thereof (for example, P3HT and the like), fullerene and derivatives thereof (PCMB and the like), TCNQ, perylene and derivatives thereof, porphyrin and derivatives thereof, acridine and derivatives thereof, coumarin and derivatives thereof, quinacrodone and the derivatives thereof, cyanine and derivatives thereof, square lyrium and derivatives thereof, oxazine and derivatives thereof, T hexane triphenylamine and derivatives thereof, bezidine and derivatives thereof, pyrazoline and derivatives thereof, steel amine and derivatives thereof, hydrazine and derivatives thereof, tiphenylmethane and derivatives thereof, carbazole and derivatives thereof, polysilane and derivatives thereof, thiophene and derivatives thereof, polyamine and derivatives thereof, oxadiazole and derivatives thereof, triazole and derivatives thereof, triazine and derivatives thereof, quinozaline and derivatives thereof, phenanthroline and derivatives thereof, quinolone aluminum and derivatives thereof, polyparaphenylene vinylene and derivatives thereof, polyfluorene and derivatives thereof, polyvinylcarbazole and derivatives thereof, polythiol and derivatives thereof, polypyrrole and derivatives thereof, and polythiophene and derivatives thereof. Among the organic materials represented as above, by selecting materials having peak sensitivity in the wavelength regions of red (R), green (G), and blue (B), the photoelectric conversion layer that configures the RGB can be configured. In addition, by using any organic material represented as above as a single material, the organic photoelectric conversion film 91 may be formed, or two or more kinds of the organic materials represented as above may be mixed or stacked so as to form the organic photoelectric conversion film 91.

As above, although the solid-state imaging devices according to the first to eighth embodiments are configured to detect the amount of incident light of visible light, the present disclosure is not limited to being applied to a solid-state imaging device that captures an image by detecting the distribution of the amount of incident light of visible light. Other than that, the present disclosure can be also applied to a solid-state imaging device that captures the distribution of the amount of incident light of infrared light, X rays, particles, or the like as an image. Furthermore, the present disclosure can be applied to the overall solid-state imaging devices (physical amount distribution detecting devices) such as a fingerprint detecting sensor that captures an image by detecting the distribution of another physical amount such as pressure, electrostatic capacitance, or the like in the broadest meaning.

In the above-described exemplary embodiments, the second area is configured as a gap (opening). However, for example, in the transparent electrode 14 illustrated in FIG. 3, the second area may be configured by (for example, filled with) a certain light transmitting material.

In addition, in a case where the second area is configured by a material having optical transparency, the material filled in the second area may protrude upward from the front face (graphene face) of the first area. Furthermore, the same material as that filled in the second area may overlap the whole or a part of the front face of the first area. For example, a convex-shaped second area or a second area protruding from the front face of the first area can be formed by, after an opening is arranged in the graphene, filling a resin in the opening so as to form the front face in the shape of a semi-circle and slightly protrude from the first area and hardening the resin in the state.

Here, it is preferable that the second area is configured by using a material that has light transmittance higher than the light transmittance of the graphene as a single layer, and, for example, it is preferable that the second area is filled with a graphene oxide, a transparent polymer material, or the like. As examples of the transparent polymer material, there are polyethylene, polypropylene, polyethylene terephthalate, polystyrene, ABS resin, acryl, polyamide, polycarbonate, fluorinated resin, phenol resin, melamine, epoxy, and the like.

As described above, in a case where the second area of the transparent electrode 14 is configured by using a material having light transmittance higher than that of the graphene as a single layer, the light transmittance of the second area is higher than that of the first area. Accordingly, the light transmittance of the whole transparent electrode 14 is higher than that of the graphene as a single layer.

In addition, in a case where the transparent electrode is configured by stacking sheets formed from a plurality of graphenes, it is preferable that the second areas of each layer are laid out so as not to confront each other. By shifting the second areas of the graphenes of the upper and lower layers, for example, the openings from each other, the whole transmittance can have uniformity.

Furthermore, as the solid-state imaging device according to the first embodiment, although the CCD-type solid-state imaging device has been described as an example, a CMOS-type solid-state imaging device may be used. In addition, the solid-state imaging devices according to the second to eighth embodiments may be CCD-type solid-state imaging devices or CMOS-type solid-state imaging devices. Furthermore, in the solid-state imaging devices according to the first to eighth embodiments, although an example has been described in which the wiring layer is formed on the light emission side of the substrate, the configuration according to an embodiment of the present disclosure can be also applied to a rear-face emission-type solid-state imaging device in which the wiring layer is formed on a side opposite to the light emission side.

In addition, the present disclosure is not limited to the solid-state imaging device that reads out a pixel signal from each unit pixel by scanning each unit pixel of the pixel area in units of rows. Thus, an embodiment of the present disclosure can be applied also to a solid-state imaging device of the X-Y address type that selects an arbitrary pixel in units of pixels and reads out signals in units of pixels from the selected pixel.

Furthermore, the solid-state imaging device may have a form that is formed as one chip or a module-shaped form having an imaging function in which a pixel area and a signal processing unit or an optical system are arranged so as to be packaged.

In addition, the present disclosure is not limited to being applied to the solid-state imaging device but may be applied to an imaging apparatus. Here, the imaging apparatus is a camera system such as a digital still camera or a video camera or an electronic apparatus such as a cellular phone that has an imaging function. Furthermore, there is a case where a form in the module shape that is mounted in an electronic apparatus, in other words, a camera module may be configured as an imaging apparatus.

9. Ninth Embodiment

Electronic Apparatus

Figure 29:
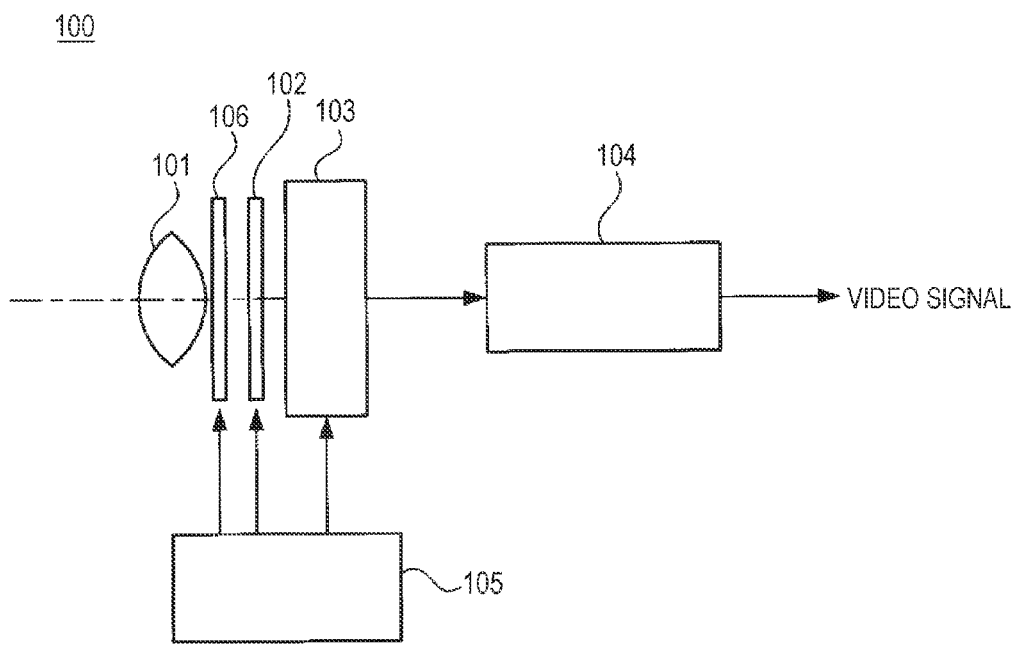
FIG. 29 is a schematic configuration diagram of an electronic apparatus according to a ninth embodiment of the present disclosure.

Next, an electronic apparatus according to a ninth embodiment of the present disclosure will be described. FIG. 29 is a schematic configuration diagram of an electronic apparatus 100 according to the ninth embodiment of the present disclosure.

The electronic apparatus 100 according to this embodiment includes a solid-state imaging device 103, an optical lens 101, an aperture diaphragm 106, a shutter device 102, a driving circuit 105, and a signal processing circuit 104. The electronic apparatus 100 of this exemplary embodiment represents an embodiment in a case where the solid-state imaging device 1 according to the first embodiment of the present disclosure as the solid-state imaging device 103 is used in an electronic apparatus (camera).

The optical lens 101 images image light (incident light) transmitted from a subject on an imaging surface of the solid-state imaging device 103. Accordingly, signal charge is accumulated inside the solid-state imaging device 103 for a predetermined time. The aperture diaphragm 106 adjusts the brightness by controlling light beams. The shutter device 102 controls the light emitting period and the light shielding period for the solid-state imaging device 103. The driving circuit 105 supplies a driving signal that is used for controlling the transfer operation of the solid-state imaging device 103, the operation of the aperture diaphragm 106, and the shutter operation of the shutter device 102. The solid-state imaging device 103 performs signal transmission in accordance with the driving signal (timing signal) that is supplied from the driving circuit 105. The signal processing circuit 104 performs various signal processing. A video signal for which the signal processing has been performed is stores in a storage medium such as a memory or is output to a monitor.

According to the electronic apparatus 100 of this exemplary embodiment, the dynamic range of the solid-state imaging device 103 is magnified so as to improve the image quality.

The electronic apparatus 200 to which the solid-state imaging device 1 can be applied is not limited to a camera but can be applied to a digital still camera, an imaging apparatus such as a mobile device camera module of a cellular phone or the like.

In this exemplary embodiment, although the solid-state imaging device 1 according to the first embodiment is configured to be used in an electronic apparatus as the solid-state imaging device 103, any of the solid-state imaging devices manufactured according to the second to eighth embodiments can be used.

The dimming control laminated film built in the solid-state imaging devices according to the above-described second to eighth embodiments may be used in a shutter device Or an aperture diaphragm of the electronic apparatus. Hereinafter, an example will be illustrated in which the dimming control laminated film is used as each unit configuring the electronic apparatus.

10. Tenth Embodiment

Electronic Apparatus

Figure 30:
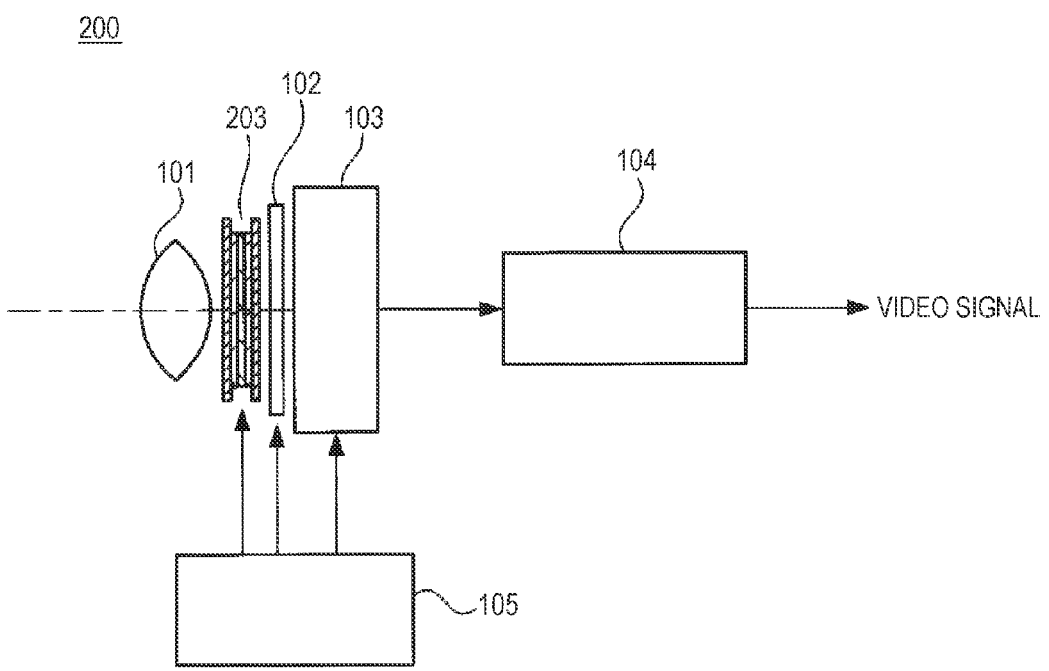
FIG. 30 is a schematic configuration diagram of an electronic apparatus according to a tenth embodiment of the present disclosure.

Next, an electronic apparatus according to a tenth embodiment of the present disclosure will be described. FIG. 30 is a schematic configuration diagram of an electronic apparatus 200 according to this exemplary embodiment. The electronic apparatus 200 of this exemplary embodiment is an example in which the dimming control laminated film 227 is used as the aperture diaphragm 203. In FIG. 30, to a portion corresponding to that illustrated in FIG. 29, the same reference numeral is assigned, and duplicate description thereof will not be presented.

In the electronic apparatus 200 of this exemplary embodiment, a dimming control laminated film 227 that configures the aperture diaphragm 203 is formed in a course between the optical lens 101 and the shutter device 102. The dimming control laminated film 227 is configured by a laminated film that is formed from a dimming control layer 224, a solid electrolyte layer 225, and an ion storing layer 226 and first and second transparent electrodes 222 and 223 that hold them therebetween. At this time, the direction of stacking the first transparent electrode 222, the dimming control layer 224, the solid electrolyte layer 225, the ion storing layer 226, and the second transparent electrode 223 is configured to be the incidence direction of light.

In addition, in this exemplary embodiment, as the solid-state imaging device 103, any of the solid-state imaging devices according to the first to eighth embodiments may be used or a general solid-state imaging device may be used. Thus, in this exemplary embodiment, the configuration of the solid-state imaging device 103 is not particularly limited.

Also in this embodiment, the first transparent electrode 222 and the second transparent electrode 223, similarly to the first and second embodiments, are configured by film-shaped graphene having an opening and can be formed similarly to the first embodiment. In addition, as the materials of the dimming control layer 224, the solid electrolyte layer 225, and the ion storing layer 226, the same materials as those of the second embodiment can be used. In addition, in this exemplary embodiment, the dimming control laminated film 227 is formed in a circular shape.

The first transparent electrode 222 and the second transparent electrode 223 are configured to be supplied with desired electric potentials based on signals transmitted from the driving circuit 105, and the electric potentials are applied to the first transparent electrode 222 and the second transparent electrode 223 in a circular shape. By supplying the electric potentials between the first transparent electrode 222 and the second transparent electrode 223 in a circular shape, the transmittance of the aperture diaphragm 203 sequentially decreases from the circumferential edge, and the opening diameter of the diaphragm through which light is transmitted is changed. Accordingly, the opening diameter of the aperture diaphragm 203 changes.

However, in order to supply the electric potentials between the first and second transparent electrodes 222 and 223 in the circular shape, it may be configured such that at least one transparent electrode is configured to be separated into multiple parts in concentric shapes, and the electric potential is sequentially supplied from the transparent electrode that is formed on the outer side. Accordingly, the dimming control laminated film 227 can be used as an electrical iris system, and the transmittance thereof changes in accordance with an applied voltage.

In this exemplary embodiment, since the aperture diaphragm 203 is configure by the dimming control laminated film 227, the edge (a boundary between a portion having high transmittance and a portion having low transmittance) of the aperture diaphragm 203 is soft, whereby the iris can minimize the image artifact due to the diffraction of the aperture diaphragm.

11. Eleventh Embodiment

Electronic Apparatus

Figure 31:
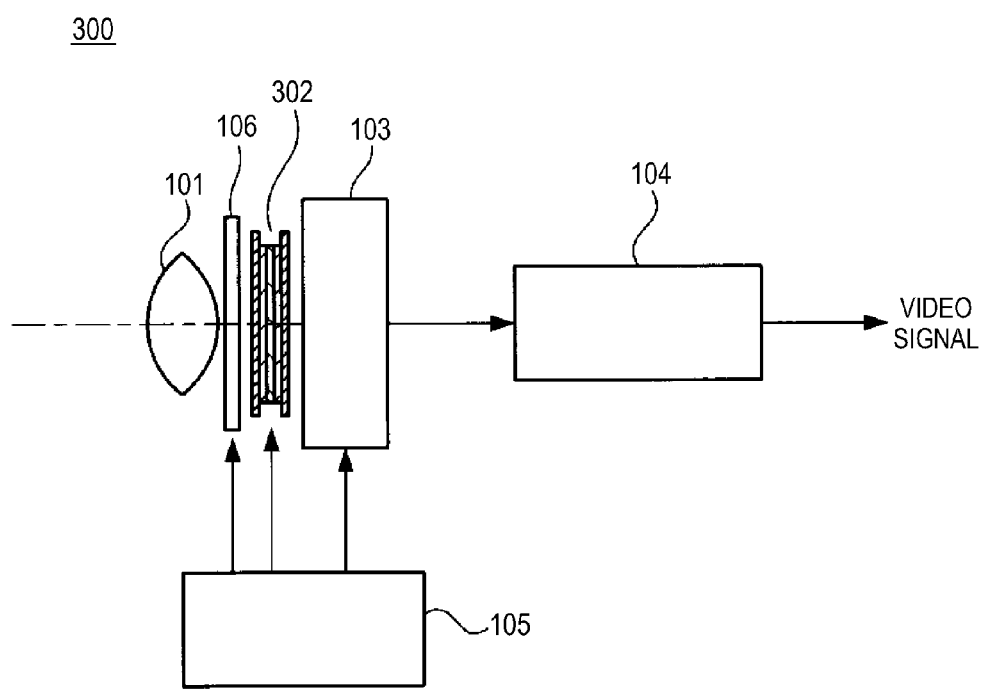
FIG. 31 is a schematic configuration diagram of an electronic apparatus according to an eleventh embodiment of the present disclosure.

Next, an electronic apparatus according to an eleventh embodiment of the present disclosure will be described. FIG. 31 is a schematic configuration diagram of the electronic apparatus according to this exemplary embodiment. An electronic apparatus 300 of this exemplary embodiment is an example in which a dimming control laminated film 327 is used as a shutter device 302. In FIG. 31, to a portion corresponding to that illustrated in FIG. 29, the same reference numeral is assigned, and duplicate description thereof will not be presented.

According to the electronic apparatus 300 of this exemplary embodiment, a dimming control laminated film 327 that configures the shutter device 302 is arranged in an optical path of light incident through an optical lens 101 and the aperture diaphragm 106, and the incident light is configured to be incident on the solid-state imaging device 103 through the shutter device 302. The shutter device 302 is configured by a laminated film that is formed from a dimming control layer 324, a solid electrolyte layer 325, and an ion storing layer 326 and first and second transparent electrodes 322 and 323 that hold them therebetween. At this time, the direction of stacking the first transparent electrode 322, the dimming control layer 324, the solid electrolyte layer 325, the ion storing layer 326, and the second transparent electrode 323 is configured to be the incidence direction of light.

Also in this embodiment, the first transparent electrode 322 and the second transparent electrode 323 are configured by film-shaped graphene having an opening, and the transparent electrodes can be formed similarly to the first embodiment. In addition, as the materials of the dimming control layer 324, the solid electrolyte layer 325, and the ion storing layer 326, the same materials as those of the second embodiment can be used.

The first transparent electrode 322 and the second transparent electrode 323 are configured to be supplied with desired electric potentials from the driving circuit 105 at timing that is based on the shutter speed. By supplying the desired electric potentials between the first transparent electrode 322 and the second transparent electrode 323, the light transmittance can be adjusted. Accordingly, at the time of exposure, light is transmitted with high transmittance, and, at the time of shielding light, light can be shielded with high light shielding rate. As in this exemplary embodiment, by using the dimming control laminated film 327 as the shutter device, a moving mechanism having a large scale is not necessary, whereby a decrease in size can be achieved.

In addition, in this embodiment, since the first and second transparent electrodes 322 and 323 configuring the dimming control laminated film 327 are configured by using film-shaped graphene having an opening, the maximum transmittance is higher than that of the transparent electrode that is formed from ITO. In addition, by changing the aperture ratio of the transparent electrodes, the transmittance can be changed. Accordingly, sufficient transmittance can be acquired at the time of exposure.

In the above-described tenth and eleventh embodiments, the openings formed in the first and second transparent electrodes used in the dimming control laminated film are set in accordance with the performance demanded by the device. In addition, in the above-described tenth and eleventh embodiments, the dimming control laminated film is configured to be used in the aperture diaphragm or the shutter device, by variously setting the shape of the openings of the transparent electrodes formed from graphene, they may be used as an apodizing mask.

As above, in the present disclosure, by using graphene having an opening as the transparent electrode, the range of the applications to which the configuration can be applied can be widened. As described above, in the transparent electrode formed from ITO in the related art, since the transmittance under light is 90%, it is not practical to use the transparent electrode as a sensor, a shutter, an aperture diaphragm, or the like. In the present disclosure, by forming the transparent electrodes used in the above-described devices by using graphene films having openings, the transmittance can be increased up to 99% or more, whereby it can be sufficiently used in the sensor, the shutter, and the aperture diaphragm described above.

As above, the embodiments of the present disclosure have been illustrated as the first to eleventh embodiments, the present disclosure is not limited to the above-described example, and various changes can be made therein within a scope not departing from the concept thereof. In addition, the configurations according to the first to eleventh embodiments may be configured to be combined together.

Furthermore, the present disclosure may be implemented as the following configurations.

(1) A solid-state imaging device including: a substrate; a photoelectric conversion unit that is formed on the substrate and generates signal charge in correspondence with a light amount of incident light; and a transparent electrode that is formed in an upper portion of the substrate and includes a first area formed from a nano carbon material and a second area that is brought into contact with the first area and has light transmittance higher than that of the first area.

(2) The solid-state imaging device described in (1), wherein the second area is formed from a gap, graphene oxide, or a transparent polymer material.

(3) The solid-state imaging device described in (1) or (2), wherein the second area is formed from a gap, and an opening diameter of the gap is smaller than an area of a unit pixel.

(4) The solid-state imaging device described in any one of (1) to (3), wherein a width of a narrowest portion of the first area is larger than 10 nm.

(5) The solid-state imaging device described in any one of (1) to (4), wherein a dimming control laminated film that adjusts a light amount of light incident on a light incident side of the substrate is formed, and the dimming control laminated film is configured by a dimming control reacting material layer of which transmittance changes based on an applied voltage and first and second transparent electrodes that hold the dimming control reacting material layer therebetween, and at least one of the first and second transparent electrodes is configured by the transparent electrode that is formed from the nano carbon material.

(6) The solid-state imaging device described in (5), wherein a color filter layer and an on-chip lens that are formed in order from the light incident light side of the substrate is further included, and the dimming control laminated film is arranged to the light incident side relative to the on-chip lens.

(7) The solid-state imaging device described in (5), wherein a color filter layer and an on-chip lens that are formed in order from the light incident side of the substrate is further included, and the dimming control laminated film is formed between the substrate and the color filter layer.

(8) The solid-state imaging device described in (5), wherein an accumulated charge detecting circuit that detects signal charge generated by the photoelectric conversion unit is connected to the first transparent electrode, and a voltage based on the signal charge generated by the photoelectric conversion unit is applied to the first transparent electrode.

(9) The solid-state imaging device described in any one of (5) to (8), wherein the first transparent electrode is formed to be separated for each predetermined pixel.

(10) The solid-state imaging device described in any one of (5) to (8), wherein the dimming control laminated film is formed only in an upper portion of the photoelectric conversion unit that corresponds to the predetermined pixel.

(11) The solid-state imaging device described in any one of (1) to (10), wherein the transparent electrode is configured by a single layer or a plurality of layers of a film-shaped nano carbon material.

(12) The solid-state imaging device described in any one of (1) to (11), wherein the transparent electrode is configured by a plurality of layers of film-shaped nano carbon materials, and the second areas of each layer are laid out not so as to confront each other.

(13) The solid-state imaging device described in any one of (1) to (12), wherein the gap formed in the transparent electrode is formed only in an effective pixel area but is not formed in a black reference pixel area.

(14) The solid-state imaging device described in any one of (5) to (13), wherein the dimming control reacting material layer is configured by an electrochromic material.

(15) The solid-state imaging device described in any one of (5) to (13), wherein the dimming control reacting material layer is configured by a liquid crystal layer.

(16) The solid-state imaging device described in any one of (1) to (15), wherein a photoelectric conversion layer that generates signal charge corresponding to light amount of light incident on a light incident side of the substrate is formed, and the photoelectric conversion layer is configured by an organic photoelectric conversion film that absorbs light of a predetermined wavelength and first and second transparent electrodes that hold the organic photoelectric conversion film therebetween, and at least one of the first and second transparent electrodes is formed from a nano carbon material.

(17) The solid-state imaging device described in any one of (1) to (16), wherein the nano carbon material is graphene.

(18) The solid-state imaging device described in any one of (1) to (17), wherein a desired additive is added to the transparent electrode.

(19) An electronic apparatus including: an optical lens; a solid-state imaging device that includes a substrate, a photoelectric conversion unit that is formed on the substrate and generates signal charge in correspondence with a light amount of incident light, a transparent electrode that is formed in an upper portion of the substrate, formed from a nano carbon material and has a plurality of openings, and to which light collected to the optical lens is incident; and a signal processing circuit that processes an output signal output from the solid-state imaging device.

(20) An electronic apparatus including: an optical lens; a solid-state imaging device that includes a substrate and a photoelectric conversion unit that is formed on the substrate and generates signal charge in correspondence with a light amount of incident light; an aperture diaphragm that is formed in an optical path between the optical lens and the solid-state imaging device, adjusts light beams transmitted from the optical lens, and is configured by a dimming control reacting material layer of which transmittance changes based on an applied voltage and first and second transparent electrodes that hold the dimming control reacting material layer therebetween; and a signal processing circuit that processes an output signal output from the solid-state imaging device. At least one transparent electrode of the first and second transparent electrodes is configured by a transparent electrode that is formed from a nano carbon material having a plurality of openings.

(21) An electronic apparatus including: an optical lens; a solid-state imaging device that includes a substrate and a photoelectric conversion unit that is formed on the substrate and generates signal charge in correspondence with a light amount of incident light; a shutter device that is formed in an optical path between the optical lens and the solid-state imaging device, controls an exposure time toward the photoelectric conversion unit, and is configured by a dimming control reacting material layer of which transmittance changes based on an applied voltage and first and second transparent electrodes that hold the dimming control reacting material layer therebetween; and a signal processing circuit that processes an output signal output from the solid-state imaging device. At least one transparent electrode of the first and second transparent electrodes is configured by a transparent electrode that is formed from a nano carbon material having a plurality of openings.

The present disclosure contains subject matter related to those disclosed in Japanese Priority Patent Applications JP 2011-072177 and JP 2011-271364 filed in the Japan Patent Office on Mar. 29, 2011 and Dec. 12, 2011, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a substrate;
a plurality of photoelectric conversion units that are formed on the substrate and that generate signal charge in correspondence with an amount of incident light; and
a transparent electrode that is formed in direct contact with an upper portion of the substrate, the transparent electrode comprising a first area formed from a nano carbon material and a second area that has a light transmittance higher than that of the first area,
wherein the second area includes a plurality of openings formed within the first area,
wherein the plurality of openings are distributed within the first area in at least two dimensions, and wherein the transparent electrode extends across the plurality of photoelectric conversion units.

2. The solid-state imaging device according to claim 1, wherein the second area includes at least one of a plurality of gaps, a graphene oxide material, or a transparent polymer material.

3. The solid-state imaging device according to claim 1, wherein a diameter of each of the plurality of openings is smaller than an area of a unit pixel.

4. The solid-state imaging device according to claim 3, wherein a width of a narrowest portion of the first area is larger than 10 nm.

5. The solid-state imaging device according to claim 1, further comprising a dimming control laminated film that adjusts an amount of light incident on a light incident side of the substrate, and
wherein the dimming control laminated film is configured by a dimming control reacting material layer of which transmittance changes based on an applied voltage and first and second transparent electrodes that hold the dimming control reacting material layer therebetween, and at least one of the first and second transparent electrodes is configured by the transparent electrode that is formed from the nano carbon material.

6. The solid-state imaging device according to claim 5, further comprising:
a color filter layer and an on-chip lens that are formed in order from the light incident side of the substrate,
wherein the dimming control laminated film is arranged on the light incident side relative to the on-chip lens.

7. The solid-state imaging device according to claim 5, further comprising:
a color filter layer and an on-chip lens that are formed in order from the light incident side of the substrate,
wherein the dimming control laminated film is formed between the substrate and the color filter layer.

8. The solid-state imaging device according to claim 5, further comprising an accumulated charge detecting circuit that detects the signal charge generated by each of the plurality of photoelectric conversion units connected to the first transparent electrode, and
wherein a voltage based on the signal charge generated by each of the plurality of photoelectric conversion units is applied to the first transparent electrode.

9. The solid-state imaging device according to claim 5, wherein the first transparent electrode is formed to be separated for each predetermined pixel.

10. The solid-state imaging device according to claim 5, wherein the dimming control laminated film is formed only in an upper portion of the photoelectric conversion unit that corresponds to a predetermined pixel.

11. The solid-state imaging device according to claim 1, wherein the transparent electrode is configured by a single layer or a plurality of layers of a film-shaped nano carbon material.

12. The solid-state imaging device according to claim 1, wherein the transparent electrode is configured by a plurality of layers, wherein each of the plurality of layers of the transparent electrode includes the first area of film-shaped nano carbon materials and the second area, and wherein the second area of each layer in the plurality of layers are laid out without confronting each other.

13. The solid-state imaging device according to claim 1, wherein the second area includes a plurality of gaps, wherein the plurality of gaps formed in the transparent electrode are formed only in an effective pixel area.

14. The solid-state imaging device according to claim 5, wherein the dimming control reacting material layer is configured by an electrochromic material.

15. The solid-state imaging device according to claim 5, wherein the dimming control reacting material layer is configured by a liquid crystal layer.

16. The solid-state imaging device according to claim 1, wherein a photoelectric conversion layer that generates signal charge corresponding to an amount of light incident on a light incident side of the substrate is formed, and
wherein the photoelectric conversion layer is configured by an organic photoelectric conversion film that absorbs light of a predetermined wavelength and first and second transparent electrodes that hold the organic photoelectric conversion film therebetween, and at least one of the first and second transparent electrodes is formed from the nano carbon material.

17. The solid-state imaging device according to claim 1, wherein the nano carbon material is graphene.

18. The solid-state imaging device according to claim 1, wherein an additive is added to the transparent electrode.

19. An electronic apparatus comprising:
an optical lens;
a solid-state imaging device that includes a substrate, a plurality of photoelectric conversion units that are formed on the substrate and that generate signal charge in correspondence with an amount of incident light, and
a transparent electrode that is formed in direct contact with an upper portion of the substrate, the transparent electrode comprising a first area formed from a nano carbon material and a second area that has a light transmittance that is higher than a light transmittance of the first area,
wherein the second area includes a plurality of openings within the first area,
wherein the plurality of openings are distributed within the first area in at least two dimensions, wherein the transparent electrode extends in at least two dimensions, and wherein light collected by the optical lens is incident on the solid: state imaging device; and
a signal processing circuit that processes an output signal output from the solid-state imaging device.

20. An electronic apparatus comprising:
an optical lens;
a solid-state imaging device that includes a substrate and a plurality of photoelectric conversion units that are formed on the substrate and that generate signal charge in correspondence with an amount of incident light;
an aperture diaphragm that is formed in an optical path between the optical lens and the solid-state imaging device, adjusts light beams transmitted from the optical lens, and is configured by a dimming control reacting material layer of which transmittance changes based on an applied voltage and first and second transparent electrodes that hold the dimming control reacting material layer therebetween,
wherein the first and second transparent electrodes are in direct contact with an upper portion of the substrate; and
a signal processing circuit that processes an output signal output from the solid-state imaging device,
wherein at least one transparent electrode of the first and second transparent electrode has a first area that is formed from a nano carbon material and that has a plurality of openings formed within the first area,
wherein the plurality of openings are distributed within two dimensions, and wherein the at least one transparent electrode extends across the plurality of photoelectric conversion units.

21. An electronic apparatus comprising:
an optical lens;
a solid-state imaging device that includes a substrate and a plurality of photoelectric conversion units that are formed on the substrate and that generate signal charge in correspondence with an amount of incident light;
a shutter device that is formed in an optical path between the optical lens and the solid-state imaging device, controls an exposure time toward the plurality of photoelectric conversion units, and is configured by a dimming control reacting material layer of which transmittance changes based on an applied voltage and first and second transparent electrodes that hold the dimming control reacting material layer therebetween, wherein the first and second transparent electrodes are in direct contact with an upper portion of the substrate; and
a signal processing circuit that processes an output signal output from the solid-state imaging device,
wherein at least one transparent electrode of the first and second transparent electrode has a first area that is formed from a nano carbon material and that has a plurality of openings formed within the first area, wherein the plurality of openings are distributed within two dimensions, and wherein the at least one transparent electrode extends across the plurality of photoelectric conversion units.

* * * * *